United States Patent
Dasbach

(10) Patent No.: US 12,410,946 B2
(45) Date of Patent: Sep. 9, 2025

(54) DEFORMABLE COMPOSITE MATERIAL FOR UNCOVERED SOLAR ENERGY ABSORBENT COLLECTOR PANELS WITH LOW INFRARED RADIATION LOSSES

(71) Applicant: ALMECO GMBH, Bernburg (DE)

(72) Inventor: Reinhard Dasbach, Bernburg (DE)

(73) Assignee: ALMECO GMBH, Bernburg (DE)

(*) Notice: Subject to any disclaimer, the term of this patent is extended or adjusted under 35 U.S.C. 154(b) by 387 days.

(21) Appl. No.: 18/033,270

(22) PCT Filed: Sep. 21, 2021

(86) PCT No.: PCT/EP2021/075878
§ 371 (c)(1),
(2) Date: Apr. 21, 2023

(87) PCT Pub. No.: WO2022/089840
PCT Pub. Date: May 5, 2022

(65) Prior Publication Data
US 2023/0400224 A1    Dec. 14, 2023

(30) Foreign Application Priority Data
Oct. 26, 2020   (EP) ..................................... 2020383

(51) Int. Cl.
    C23C 14/06    (2006.01)
    C23C 14/00    (2006.01)
    (Continued)

(52) U.S. Cl.
    CPC .......... F24S 20/66 (2018.05); C23C 14/0036 (2013.01); C23C 14/021 (2013.01);
    (Continued)

(58) Field of Classification Search
    CPC .......... F24S 20/66; F24S 70/225; F24S 70/30; C23C 14/0036; C23C 14/021;
    (Continued)

(56) References Cited

U.S. PATENT DOCUMENTS 9,222,703 B2 * 12/2015 Dasbach ............... B23K 26/18
2005/0252507 A1   11/2005 Hollick
(Continued)

FOREIGN PATENT DOCUMENTS

DE   102012112780 B3   5/2014
EP         2499439 B1   5/2014
(Continued)

OTHER PUBLICATIONS

International Search Report and Written Opinion for International Patent Application No. PCT/EP2021/075878 mailed on Dec. 14, 2021.
(Continued)

*Primary Examiner* — Avinash A Savani
(74) *Attorney, Agent, or Firm* — HUNTON ANDREWS KURTH LLP

(57) ABSTRACT

The present invention relates to a composite material suitable for the conversion of solar radiation to heat. The composite material comprises a carrier (1) which is provided on at least one side thereof with a multilayer system comprising at least five layers, an adhesion layer (2), a protection layer (3), a first absorber layer (4), a second absorber layer and an antireflection and protection layer (6). The present invention further relates to a selective solar radiation absorbent wall panel or roof panel, a solar facade or solar roof comprising the solar radiation absorbent wall panel or roof panel, and to a method for heating and/or ventilating buildings.

20 Claims, 12 Drawing Sheets

(51) Int. Cl.
*C23C 14/02* (2006.01)
*C23C 14/08* (2006.01)
*C23C 14/16* (2006.01)
*C23C 14/30* (2006.01)
*C23C 14/35* (2006.01)
*F24S 20/66* (2018.01)
*F24S 70/225* (2018.01)
*F24S 70/30* (2018.01)

(52) U.S. Cl.
CPC ........ *C23C 14/024* (2013.01); *C23C 14/0641* (2013.01); *C23C 14/083* (2013.01); *C23C 14/165* (2013.01); *C23C 14/30* (2013.01); *C23C 14/35* (2013.01); *F24S 70/225* (2018.05); *F24S 70/30* (2018.05)

(58) Field of Classification Search
CPC ............. C23C 14/024; C23C 14/0641; C23C 14/083; C23C 14/165; C23C 14/30; C23C 14/35
USPC ....................................................... 126/621
See application file for complete search history.

(56) References Cited

U.S. PATENT DOCUMENTS

| 2010/0294263 | A1* | 11/2010 | Kuckelkorn | C23C 28/341 126/714 |
| 2015/0232377 | A1* | 8/2015 | Knoll | C03C 17/3644 428/428 |
| 2018/0076342 | A1 | 3/2018 | Liu et al. | |

FOREIGN PATENT DOCUMENTS

| WO | 95/17533 A1 | 6/1995 |
| WO | 2009051595 A1 | 4/2009 |

OTHER PUBLICATIONS

Extended European Search Report for European Patent Application No. 20203830.3 mailed on Jun. 8, 2021.
O. A. Panchenko et al., "The spectral selective absorber layers created by the dc reactive magnetron sputtering," Probl. At. Sci. Technol. Ser.: Plasma Phys., 132 (1999), 253 (abstract).
H. Pulker et al., "Selective absorber systems based on Sn, Cr oxides and Al nitride," Int. Conference on Coatings on Glass, High-Perform. Coat. Transparent Syst. Large-Area High-Vol. Appl., 1999.
W. Graf et al., "Development of large area sputtered solar absorber coatings," Journal of Non-Crystalline Solids 218 (1997) 380-387; Elsevier Science B.V., 1997.
C. E. Kennedy, "Review of Mid- to High Temperature Solar Selective Absorber Materials," NREL (National Renewable Energy Laboratory), Technical Report, Jul. 2002.
C. Nunes et al., "Graded selective coatings based on chromium and titanium oxynitride," Thin Solid Films, 442 (2003) 173-178.
M. Kohl et al., "Advanced procedure for the assessment of the lifetime of solar absorber coatings," Solar Energy Materials & Solar Cells 84 (2004) 275-289.
P.H. Holloway et al., "Oxidation of Electrodeposited black chrome selective solar absorbs films," Thin Solid Films, 72 (1980) 121-128.
C. Hildebrandt et al., "High-temperature stable absorber layers for linear concentrating solar thermal power plants," Dissertation 2009, University of Stuttgart.
M. Dudita et al., "Durability of Spectrally Selective Absorber Coatings Used for Unglazed Solar Thermal Collectors," EuroSun 2016, ISES Conference Proceedings (2016).
Vakuumbeschichtung, vol. 5, pp. 187-199, VDI-Verlag 1993.
Carlsson, B., et al., "Accelerated Life Testing of Solar Energy Materials; Case Study of some Selective Solar Absorber Coating Materials for DHW Systems," A report of IEA Task X; Solar Materials Research and Development, SP Report 94:13; Feb. 1994.

\* cited by examiner

DEFORMABLE COMPOSITE MATERIAL FOR UNCOVERED SOLAR ENERGY ABSORBENT COLLECTOR PANELS WITH LOW INFRARED RADIATION LOSSES The present invention relates to a composite material absorbing solar radiation and suitable for the conversion of solar radiation to heat with high efficiency. The composite material comprises a carrier which is provided on at least one side thereof with a multilayer system comprising at least five layers. The composite material of the present invention is particularly suitable as a selective solar absorber for use in solar thermal collectors. The present invention further relates to a selective solar radiation absorbent wall panel or roof panel, a solar facade or solar roof comprising the solar radiation absorbent wall panel or roof panel with low infrared radiation losses, and to a method for heating and/or ventilating buildings.

BACKGROUND OF THE INVENTION AND PRIOR ART

Solar thermal collectors should convert incident solar radiation into usable heat. The heat is either transferred to a liquid or gaseous heat carrier medium, which is used to transport the heat to the heat consumer.

Normally, solar collectors are constructed in such a way that the solar absorber is located in a housing that is thermally insulated to avoid heat losses through heat conduction and is provided with a transparent cover (glass or double-walled polycarbonate sheets) on the side facing the sun to avoid convective losses. Usually, pipes or channels in which the heat carrier medium is conducted are attached to the solar absorber.

For some applications, however, it is expedient to use so-called uncovered solar collectors, in which the solar absorber is directly exposed to the environment. This particularly applies to thermal solar collectors for the generation of heated air, for example for the ventilation or heating of buildings, for thermo solar-active facade elements or for the use in combination with heat pump systems (e.g. for thermal regeneration).

For some of these applications the composite material should preferably be deformable (e.g. by roll forming or deep drawing) allowing it to be used directly as a facade element.

In order to obtain a high solar yield despite the lack of a transparent cover, a solar absorber with a selective coating should be used. Materials provided with such a coating are known as selective absorbers.

The selective absorber must absorb the incident solar radiation in the range of 0.3 to 2.5 µm in the best possible manner and convert it into heat; that is, the reflection of the absorber surface should be as low as possible in this wavelength range. In order to minimize losses through infrared radiation when the absorber is heated by the solar radiation, the reflection of a selective absorber in the wavelength range from 2.5 µm and 50 µm should be as high as possible to obtain lowest possible thermal emittance, considering Kirchhoff's law of thermal radiation and the conservation of energy. This applies to the side of the absorber exposed to solar radiation as well as to the rear side. Therefore, for the use in a solar collector, it is also important to use a material that meets the requirement of high reflection in the wavelength range from 2.5 µm to 50 µm on both sides of the material.

Many materials having a selective solar absorber coating are already known. However, most of these materials are not sufficiently corrosion resistant to be exposed to the weather for many years, e.g. more than 20 years, without being significantly degraded.

Lacquer systems with a high degree of solar absorptance (>90%) but also a high thermal emittance (>80% at 100° C. absorber surface temperature), anodized aluminum with a medium degree of solar absorptance (<90%) but a thermal emittance >50%, or black chrome, which also has a high solar absorptance coefficient (>90%) and a rather low thermal emittance around 12%, have been used for these applications. However, since black chrome is deposited in a wet chemical process that produces chromium (VI), this coating is nowadays prohibited or restricted in many countries. Furthermore, it can be deposited only on copper or stainless steel but not on aluminum.

FIG. 1 shows the heat radiation losses of an uncovered absorber as a function of the surface temperature and the thermal emittance of the absorber material calculated from the Stefan Boltzmann law. The graph shows that the use of lacquer systems with a thermal emittance >80% (upper three curves in the graph with open symbols) results in high losses due to heat radiation. These losses can be significantly reduced by using selective absorbers with low thermal emittance <15% (such as the lower three curves in the graph with filled symbols).

The following selective absorber coatings for use in glazed collectors are known:

A composite material having such optical properties is known under the name TiNOX® and is described in WO 95/17533 A1. The TiNOX® material is a so-called reflector absorber tandem (cf., e.g., "Solar Energy, the State of the Art" by Jeffrey Gordon, 2001 ISES, ISBN 1 902916 23 9). The above-described optical properties are obtained in this case by applying an absorber layer, which effectively absorbs the solar radiation but is extensively transparent in the range of infrared radiation, to a surface having high reflection in the wavelength range from 2.5 µm to 50 µm, preferably a metal such as Cu, Al, Mo, Au, Ag, Ta, V, Fe or alloys thereof. High reflection is thus achieved in the infrared range due to the highly reflecting surface directly under the absorber layer.

A metallic carrier material of Cu or Al, having the desired high reflection in the wavelength range of 2.5-50 µm, is preferably used as the highly reflecting surface (T1) in the TiNOX composite material. WO 95/17533 A1 also discloses that the highly reflecting surface can be produced by coating one of the above-mentioned metals on any carrier material not necessarily having reflective properties. Hence, the carrier material itself or a highly reflecting metallic coating applied to the carrier material is responsible for the reflective properties.

For TiNOX®, the first layer (T2) applied to the highly reflecting surface (mirror layer), the so-called absorber layer, preferably consists of $TiN_xO_y$ (with x, y=0.1-1.7). The topmost layer (T3) is a so-called antireflection and protection layer. This layer consists of a metal oxide, preferably $SiO_2$, $ZrO_2$, $HfO_2$, $Al_2O_3$ or $Y_2O_3$. It is used to minimize the reflection of the solar radiation on the surface of the composite material and thus to further increase the absorption of solar radiation in the composite material.

A plurality of other selective absorbers which are based on the principle of the reflector-absorber tandem are described in the literature. The absorber layer consists in most cases of a substoichiometric metal compound, or of a so-called cermet in which metal particles are distributed in a dielectric matrix. Apart from the above-mentioned titanium oxynitride, chromium oxide ($CrO_x$, with a substoichiometric quantity of oxygen relative to Cr(III)) or a "cermet" of chromium particles in stoichiometric chromium(II) oxide is frequently suggested as a light absorbing layer on the side exposed to the sun, see, e.g., C. E. Kennedy, Review of Mid- to High Temperature Solar Selective Absorber Materials, NREL (National Renewable Energy Laboratory), Technical Report, July 2002, as well as literature cited therein from 0. A. Panchenko et al., in Probl. At. Sci. Technol. Ser.: Plasma Phys., 132 (1999), 253, and in Int. Conf. Coat. Glass, High-Perform. Coat. Transparent Syst. Large-Area High-Vol. Appl., Pulker H. K. et al., Elsevier Science, Amsterdam, 1999, p. 287. Gradient layers have also been discussed in the literature, cf., e.g., B. C. Nunes et al., Thin solid films, 442 (2003), pp. 173-178. W. Graf et al. proposed an allegedly gradient mixture of chromium oxide and chromium nitride, which was sputtered in the form of a cermet directly onto a copper substrate. This mixture was developed because gradient chromium oxide layers are said to be hardly producible because of allegedly sharp stability transitions between metallic chromium and chromium oxide, so that even slight changes in the production conditions led to the deposition of metal instead of metal oxide and vice versa. This situation is said to be remedied by the addition of nitrogen to the oxygen atmosphere, because a broad range of different stoichiometries exists for the nitrides. However, this publication then describes a "cermet with a low percentage of CrN in $Cr_xO_y$" without any indication of a graduation. This cermet is said to be sufficiently resistant to moisture and temperature, the most important environmental factors for the lifetime of covered solar heat collectors.

EP 1 217 394 A1 discloses a composite material with a CrOx absorber layer for the use in solar thermal collectors comprising a layer sequence of 3 layers with an upper anti-reflection coating having a refractive index of less than 1.8.

The standard test procedure for determining the lifetime of a selective solar absorber in a covered solar collector is described in M. Kohl, M. Heck, S. Brunold, U. Frei, B. Carlsson, K. Möller: "Advanced procedure for the assessment of the lifetime of solar absorber coatings," Solar Energy Materials & Solar Cells, 84 (2004), pp. 275-289, and is defined in DIN ISO 22975-3:2014. However, substoichiometric layers have the drawback that they become hot in a glazed/covered solar thermal collector under stagnation conditions, reaching up to 230° C., and the unsaturated metal atoms will then react with the atmospheric oxygen and the layers thus become oxidic over time (cf., e.g., Holloway, P. H.; Shanker, K.; Pettit, R. B.; Sowell, R. R.: "Oxidation of electrodeposited black chrome selective solar absorber films", Thin Solid Films, Vol. 72, pp. 121-128, 1980). The absorbance decreases in this process. In addition, a diffusion process of the metal atoms from the mirror layer into the absorber layer is initiated (cf., e.g., Holloway, P. H.; Shanker, K.; Alexander, G. A.; de Sedas, L.: Oxidation and diffusion in black chrome selective solar absorber coatings, Thin Solid Films, Vol. 177, pp. 95-105, 1989). An oxidation of the mirror layer is also observed. In addition, diffusion processes within the absorber layer may lead to a reduction of the gradient (cf., e.g., Christina Hildebrandt: "High-temperature-resistant absorber layers for linearly concentrating solar thermal power plants," Dissertation 2009, University of Stuttgart). These processes result in a change (worsening) of the optical properties of the composite material during the average lifetime of the solar collector of over 20 years.

To overcome the above difficulties, EP 2 499 439 B1 provides the following solution:

An optically active multilayer system consisting of at least 5 layers is applied to a carrier material made of aluminum or an aluminum alloy, copper or stainless steel, wherein the topmost layer serves as an antireflection and protection layer and the lowermost layer of the optically active system consists of a metal or a metal alloy with an integral reflection greater than 80% in the wavelength range between 2.5 and 50 µm. This layer is usually referred to as an infrared mirror layer. An intermediate layer may be inserted between the lowermost layer of the optically active system and the carrier material in order to increase the adhesion of the multilayer system and/or to suppress the diffusion of metal from the carrier material into the multilayer system. The central layer is the actual absorber layer of the system; it is a substoichiometric metal compound of oxygen and/or nitrogen and/or carbon having the composition $Me_rAl_sN_xO_yC_z$, wherein Me is a metal from subgroup IV (e.g. T1) of the periodic system or Cr, and r and s describe the ratio of the metal and Al. An oxidically saturated (stoichiometric) metal oxide layer of aluminum or a metal from subgroup IV, V or VI, e.g. $Cr_2O_3$ or $Al_2O_3$, is located between the central layer and the antireflection and protection layer, while a metal nitride and/or metal carbide layer, which is a nitride, carbonitride or carbide of a metal from subgroup IV, V or VI of the periodic system, e.g. CrN or TiC, is located between the absorber layer and the infrared mirror layer. The topmost layer of the optically active multilayer system is a dielectric layer having a refractive index between 1.3 and 2.4, preferably between 1.3 and 2.2, particularly preferably having the composition $MeO_vN_w$, Si, Zn, Sn, Zr, Hf, Cr, Al, Y or Bi may be used as the metal Me. Fluorides may also be used as an alternative.

The two layers, which are located below and above the absorber layer, are intended to protect the latter layer; they suppress the above-described aging processes. The metal nitride or carbide below the absorber layer acts as a barrier in order to suppress the diffusion of metal atoms from the infrared mirror layer, and maybe even from the carrier material. Furthermore, it acts as a protective layer for protection against an oxidative attack of the mirror layer. The layer above the absorber layer is an oxidically saturated (stoichiometric) metal oxide layer, which cannot react further with atmospheric oxygen under exposure to temperature. It acts as a protective layer against an oxidic attack of the absorber layer.

The composite material described in EP 2 499 439 B1 has a high temperature resistance and is suitable for use in covered solar heat collectors according to IEA-SHP, DIN ISO 22975-3:2014.

In the case of uncovered collectors, in which the solar absorber is exposed directly to the environment, the selective absorber coating is exposed to completely different loads over a lifetime of 20 years. The absorber temperatures are usually much lower (max. 120° C. compared to max. 230° C. in covered collectors) and the humidity and wetting load are significantly higher (see: Dudita, M., Zenhäusern, D., Mojic, I., Thissen, B., Brunold, S.; 2016. Durability of Spectrally Selective Absorber Coatings Used for Unglazed Solar Thermal Collectors; EuroSun 2016/ISES Conference Proceedings 2016). Also, a direct wetting by rain is observed during operation which affects the interference, normally resulting in a local change of the color impression of the absorber layer. Moreover, the absorber surface is not protected against contamination with oil/grease (such as by fingerprints), which usually also leads to local changes in the color impression.

Investigations have shown that the layer system described in EP 2 499 439 B1 leads to a degradation of the infrared mirror layer under high exposure to humidity especially under condensation conditions, which results in a significant increase of the thermal emittance. This increase leads to an undesirable increase in losses through infrared radiation from the absorber surface when the surface becomes warm. The efficiency of the solar thermal absorber is thus decreased which impairs the performance of the solar thermal absorber.

The object of the present invention is therefore to provide a composite material suitable for a use as a selective solar thermal absorber which is directly exposed to the environment and can withstand harsh and humid weather conditions for a long time such as 20 years or more, ideally without decrease of performance. The composite material should further maintain its visual appearance when used as an uncovered solar thermal absorber. The composite material should also be capable of being deformed, perforated and/or embossed by standard mechanical working technologies without delamination of the coating.

To solve these objects, the present invention provides:

1. A composite material for conversion of solar radiation to heat, comprising:
   a carrier (1) comprising a side (A) and a side (B), composed of aluminum, an aluminum alloy, copper, electrolytic chromium coated steel (ECCS) (TFS (Tin Free Steel) steel)) or stainless steel, wherein at least the following layers are present on the side (A) of the carrier (1) in the following order;
   an adhesion layer (2) composed of chromium, titanium, nickel, molybdenum, tungsten, alloys of two or more of these metals, or a non-ferromagnetic nickel alloy with at least one metal selected from the group consisting of chromium, aluminum, vanadium and copper, having a thickness of 1 to 15 nm, on the carrier (1),
   a protection layer (3) composed of a nitride, a carbide or a carbonitride of a metal or of a mixture of two or more metals from subgroups IV, V or VI of the periodic system, on the adhesion layer (2);
   a first absorber layer (4) of a metal compound having a composition $(Me_rAl_{1-r})O_xN_yC_z$, wherein Me represents at least one metal selected from titanium, zirconium and hafnium, wherein r is from 0.1 to 1.0, x is from 0 to 1.9, y is from 0 to 0.95, z is from 0 to 0.5 and x+y+z is from 0.5 to 1.9, or a composition $(Cr_rAl_{1-r})O_xN_yC_z$, wherein r is from 0.1 to 1.0, x is from 0 to 1.4, y is from 0 to 0.95, z is from 0 to 0.5 and x+y+z is from 0.8 to 1.4, on the protection layer (3),
   a second absorber layer (5) of a metal compound having the composition $(Me_rAl_{1-r})O_xN_yC_z$ or $(Cr_rAl_{1-r})O_xN_yC_z$, as defined for the first absorber layer (4), on the first absorber layer (4), provided the composition is different from that in the first absorber layer (4), and
   a dielectric and/or oxidic antireflection and protection layer (6) with a refractive index from 1.8 to 2.5 in the visible wavelength range, which is selected from the group consisting of $ZrO_2$, Y stabilized $ZrO_2$, $Cr_2O_3$, $Nb_2O_5$, $Si_3N_4$, $Y_2O_3$, $Ta_2O_5$, and a mixture of $ZrO_2$ and $Ta_2O_5$, on the second absorber layer (5).

2. The composite material according to 1, wherein the refractive index of the second absorber layer (5) is higher than the refractive index of the antireflection and protection layer (6).

3. The composite material according to 1 or 2, wherein the carrier (1) has a thermal emittance according to DIN ISO 22975-3:2014, Annex A of less than 15%, preferably less than 10% and more preferably less than 5%.

4. The composite material according to any one of 1 to 3 above, wherein the carrier (1) is composed of aluminum having a purity of 99.5% or higher, copper having a purity of 99.5% or higher, or of one of the following aluminum alloys: EN AW 3103 (AlMn1), EN AW 3004 (AlMn1Mg1), EN AW 3104 (AlMn1Mg1Cu), EN AW 3005 (AlMn1Mg0,5) and EN AW 5005 A (AlMg1 (C)), or of one of the following stainless steels: 1.4541 (AISI 321), 1.4404 (AISI 316L) and 1.4301 (AISI 304).

5. The composite material according to any one of the preceding points, wherein the adhesion layer (2) is composed of chromium, molybdenum or a nickel-vanadium alloy.

6. The composite material according to any one of the preceding points, wherein the protection layer (3) is composed of CrN, CrC, CrCN, TiN or TiC.

7. The composite material according to any one of the preceding points, wherein the first absorber layer (4) is composed of $CrO_xN_yC_z$ or $(Ti_rAl_{1-r})O_xN_yC_z$, wherein r is from 0.2 to 0.7.

8. The composite material according to 7, wherein the first absorber layer (4) is composed of $CrO_xN_y$, wherein x is from 0.8 to 1.4, preferably from 0.9 to 1.2, and y is from 0.02 to 0.4, preferably from 0.05 to 0.1.

9. The composite material according to any one of the preceding points, wherein the second absorber layer (5) is composed of $CrO_xN_yC_z$ or $(Ti_rAl_{1-r})O_xN_yC_z$, wherein r is from 0.2 to 0.7.

10. The composite material according to 9, wherein the second absorber layer (5) is composed of $CrO_xN_y$, wherein x is from 1.0 to 1.4, preferably from 1.1 to 1.3, and y is from 0.02 to 0.4, preferably from 0.05 to 0.1.

11. The composite material according to any one of the preceding points, wherein the antireflection and protection layer (6) is composed of $ZrO_2$ or $Nb_2O_5$.

12. The composite material according to any one of the preceding points, further comprising a sol-gel protection layer (7) having a thickness of less than 4 μm, preferably from 1 μm to 3 μm, more preferably from 1.5 to 2.5 μm, on the antireflection and protection layer (6).

13. The composite material according to any one of the preceding points, wherein:
   the carrier (1) is composed of aluminum having a purity of 99.5% or higher,
   the adhesive layer (2) is composed of chromium,
   the protection layer (3) is composed of CrN,
   the first absorber layer (4) is composed of $CrO_xN_y$, wherein x is from 0.9 to 1.2, and y is from 0.05 to 0.1,
   the second absorber layer (5) is composed of $CrO_xN_y$, wherein x is from 1.1 to 1.3, and y is from 0.05 to 0.1, and
   the antireflection and protection layer (6) is composed of $ZrO_2$ or $Nb_2O_5$.

14. A composite material according to any one of the preceding points, wherein a side (B) of the carrier (1) is provided with an anticorrosion layer (8) formed at least by one layer selected from the group consisting of a lacquer layer, sol-gel coting, an adhesive film, and a layer selected from $ZrO_2$, $SiO_2$, $Al_2O_3$ or $Nb_2O_5$, which preferably has a thickness of 20 to 400 nm.

15. The composite material according to any one of the preceding points, particularly point 13, wherein, after 1000 h in a condensation test in a climate chamber at 75° C. air temperature with 95% relative humidity and 70° C. sample temperature, the solar absorptance is not changed more than 1% and the thermal emittance (100° C.) is not changed more than 10%.

16. The composite material according to any one of the preceding points, wherein on the side (A) the solar absorptance according DIN ISO 22975-32014; Annex A is higher than 80%, preferable higher than 90% and most preferable higher than 93% and the thermal emittance according DIN ISO 22975-3:2014; Annex A, for a surface temperature of 100° C. is less than 15%, preferably less than 10% and more preferably less than 5%, and wherein on side (B) the thermal emittance for a surface temperature of 100° C. is less than 20%, preferably less than 15% and more preferably less than 5% according DIN ISO 22975-3:2014; Annex A.

17. A solar radiation absorbent wall panel or roof panel comprising or consisting of the as composite material according to any one of the preceding points, preferably having an infrared radiation loss on side (A) at a surface temperature of 50° C. of less than 100 W/m².

18. The solar radiation absorbent wall panel or roof panel according 17 above, wherein the panel has a shape defining a space allowing heated air to be collected and conducted, said space being surrounded by the side (B) of said composite material.

19. The solar radiation absorbent wall panel or roof panel according 17 or 18 above, wherein the panel has a plurality of air inlet openings, preferably in the form of slits or holes, to allow air heated at the side (A) surface of the composite material to pass through the openings from side (A) to side (B) of the composite material.

20. The solar radiation absorbent wall panel or roof panel according to any one of 17 to 19 above, wherein the panel is provided with a ventilation stack mounted on side (B) of the composite material and communicating with the inside of a building, allowing heated air to be supplied to the inside of the building.

21. The solar radiation absorbent wall or roof panel according to any one of 17 to 20 above, wherein the panel has the shape of a trapezoidal sheet or corrugated sheet.

22. The solar radiation absorbent wall panel or roof panel according to 17 above, wherein pipes or conduits are fixed on side (B) of the composite material allowing heating of a fluid circulating in the tubes to form an uncovered solar absorber facade or roof element for the use in heat pump systems.

23. The solar radiation absorbent wall panel or roof panel according to 22 above, wherein said pipes or conduits are attached by welding, soldering, laser welding or ultrasonic welding.

24. The solar radiation absorbent wall or roof panel according to 17 above, wherein the side (B) of the composite material is attached to a facade element or roof element by means of an adhesive tape.

Thereby, a panel for a solar activated facade can be formed which can absorb and store daytime solar energy which is slowly discharged at night over a period of several hours, thereby greatly reducing the building's heating energy demand.

25. The solar radiation absorbent wall or roof panel according to 24 above, wherein the facade element or roof element is made of concrete, and wherein an array of pipes or conduits is integrated in the concrete, allowing the extraction of thermal energy from the wall panel or roof panel by means of a fluid (i.e. a gas, such as air, or a liquid).

26. A solar facade or solar roof, comprising solar radiation absorbent wall panels or roof panels according to any one of the above 17 to 25, wherein preferably a plurality of the panels are arranged so as to overlap with adjacent panels.

27. A method for heating and ventilating buildings comprising heating ambient air and supplying the heated air to a building, wherein the solar radiation absorbent wall panel or roof panel according to any one of 17 to 21 above is used.

28. The method according to 27 above, wherein a fan is used for blowing the heated air into a building.

29. The method according to 27 or 28 above, wherein the heated air is sucked through air inlet openings formed in the solar radiation absorbent wall panel or roof panel, preferably by a fan, and is supplied to or into the building, wherein a flow rate of the heated air sucked from side (A) to side (B) through the air inlet openings of the wall panel or roof panel is less than 6 cubic feet per minute per square feet of panel area (less than 110 m³/h/m).

FIGURES

FIG. 1 shows the infrared radiation loss of a solar thermal absorber surface depending on the thermal emittance and the absorber surface temperature, calculated from the Stefan Boltzmann law.

FIG. 2 schematically shows the layer structure of the composite material of the present invention.

FIG. 3 shows the reflectance spectrum of a preferred selective absorber material according to Example 1 of the present invention on an aluminum carrier (Example 1a) and on a stainless-steel carrier (Example 1b). Additionally, the solar absorptance and the thermal emittance (100°) are indicated, as calculated from the reflectance spectra according to DIN ISO 22975-3:2014 Annex A FIG. 4 shows the reflectance spectra of selective absorber materials according to the examples of the present invention. Additionally, the solar absorptance and the thermal emittance (100°) are indicated.

Figure 11:
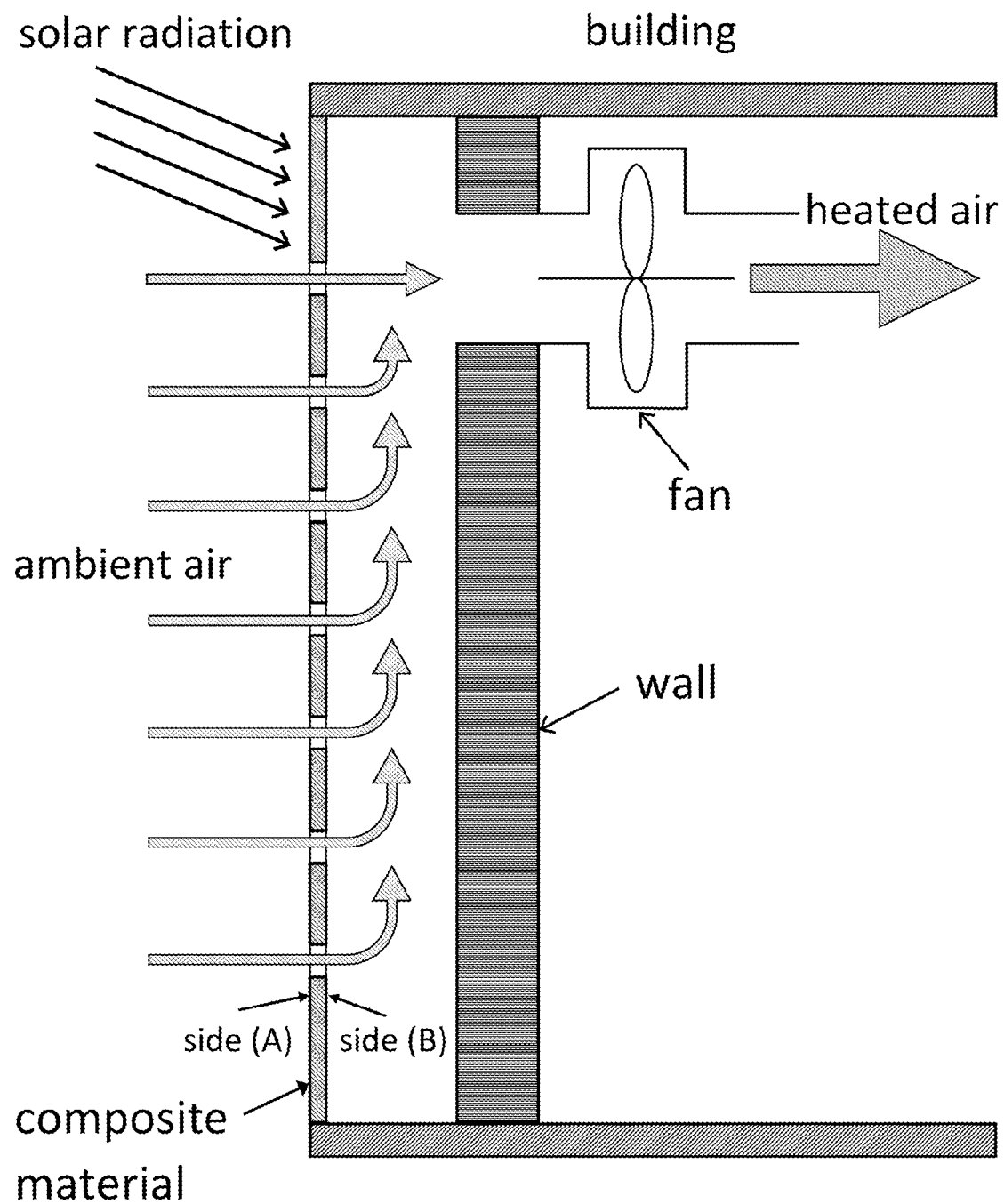

FIG. 11 schematically shows the use of solar-radiation absorbent wall panels for providing solar heated air inside buildings.

Figure 12:
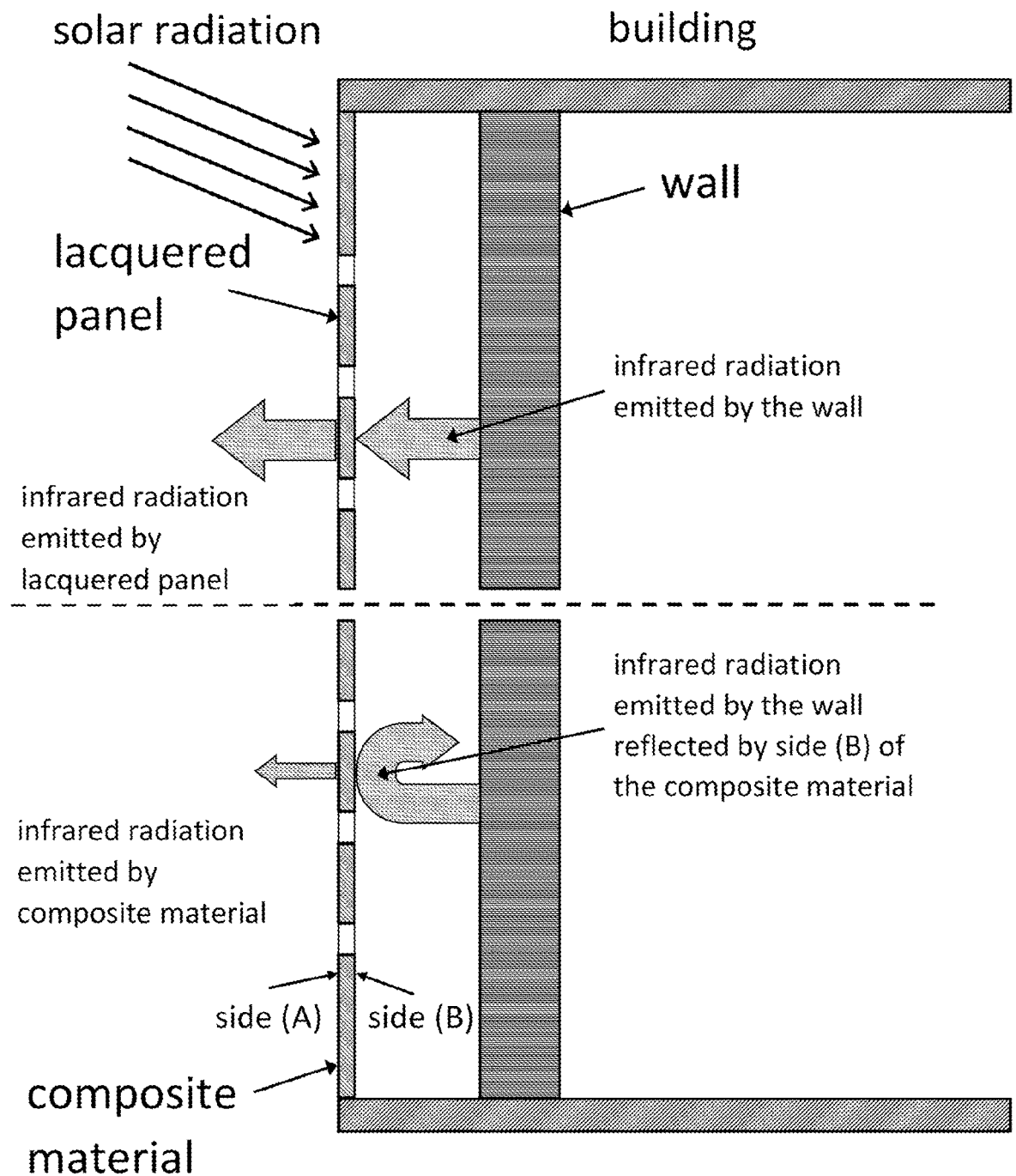

FIG. 12 schematically shows the infrared radiation balance of a solar wall panel with both side lacquered panels (top) and for a composite material according to embodiments of the present invention (lower part).

Figure 13:
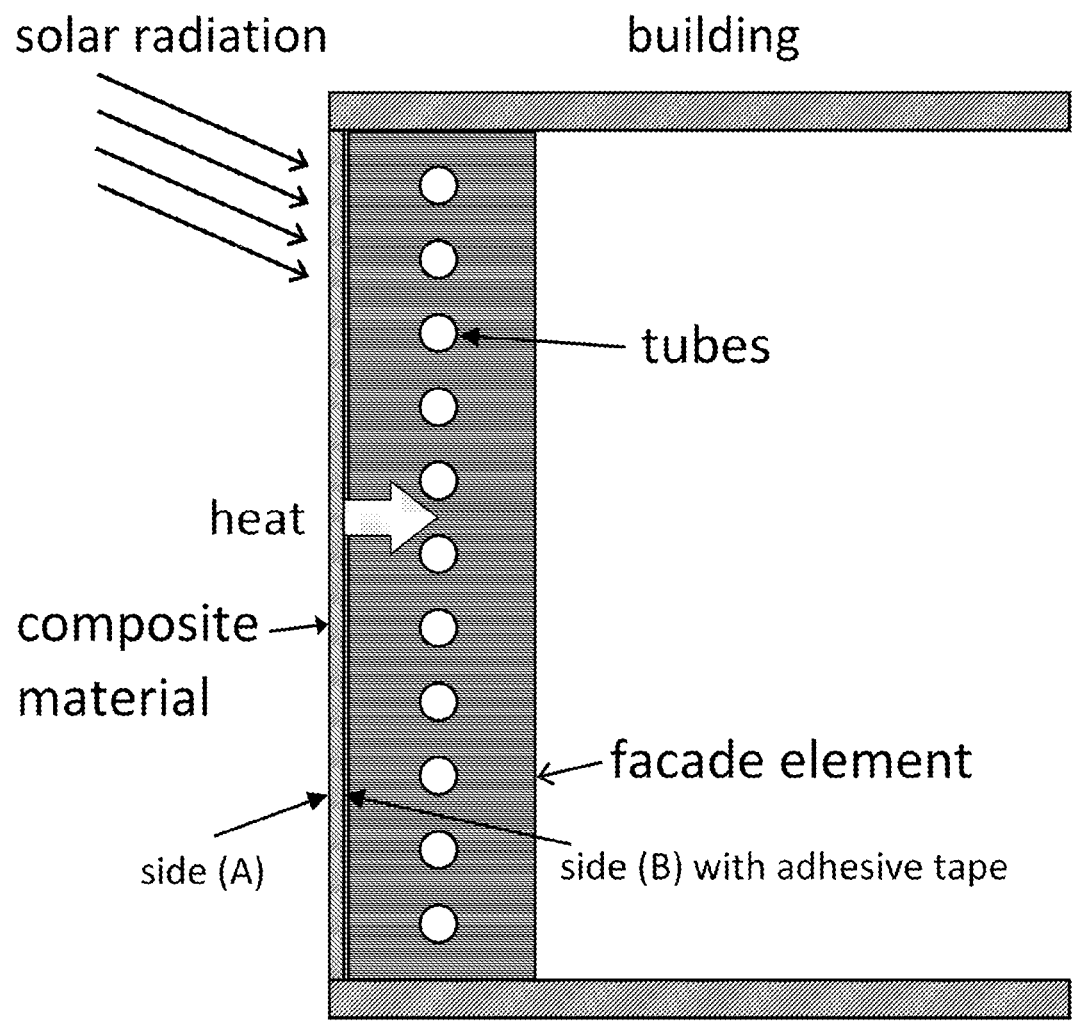

FIG. 13 schematically shows a composite material or solar wall panel according to the invention attached to a facade element for solar thermal activation of a building.

Figure 14A:
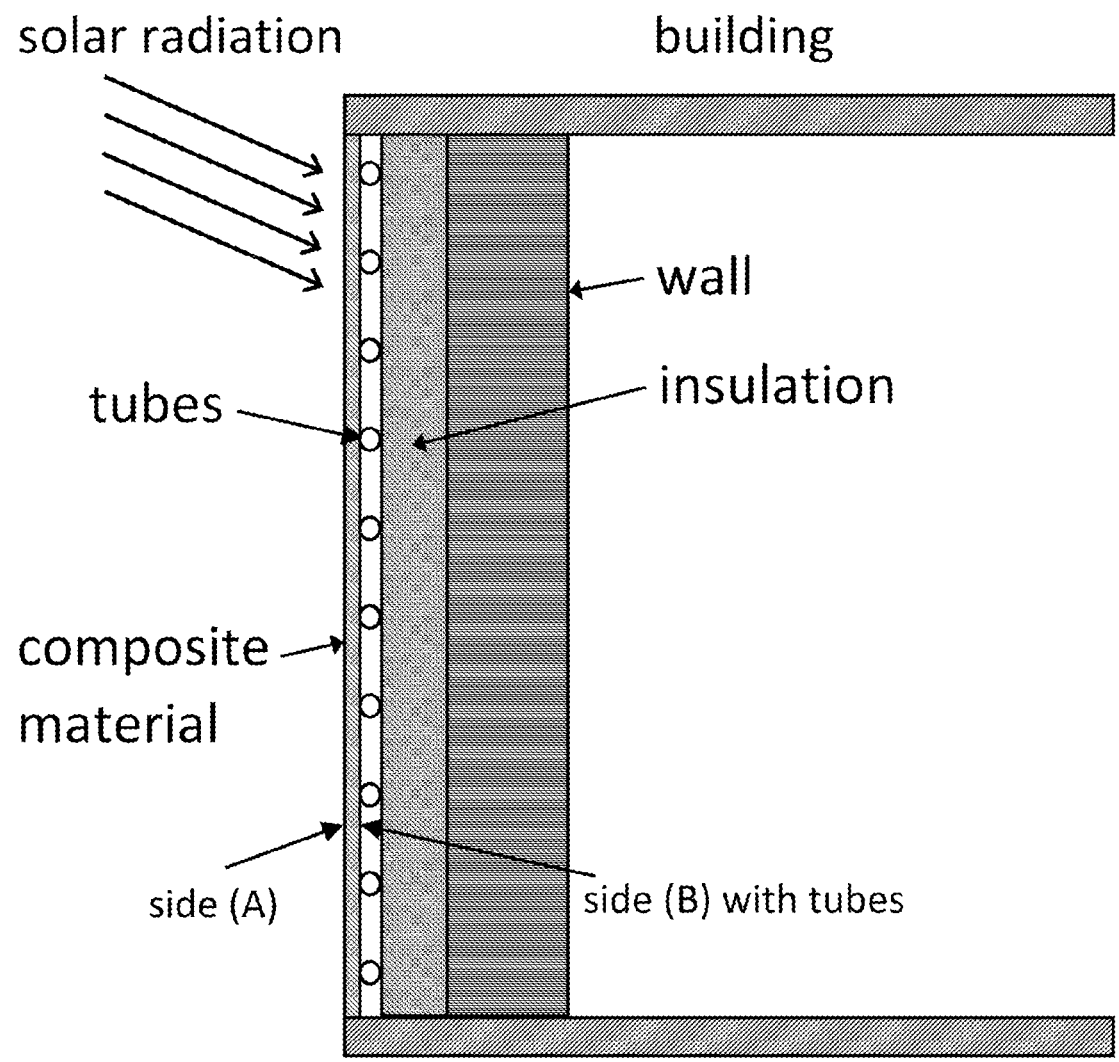

FIG. 14a shows a solar wall panel or roof panel with attached tubes containing a gaseous or liquid heat transfer medium for the use as an un-protected solar collector, especially for the use in heat pump systems.

Figure 14B:
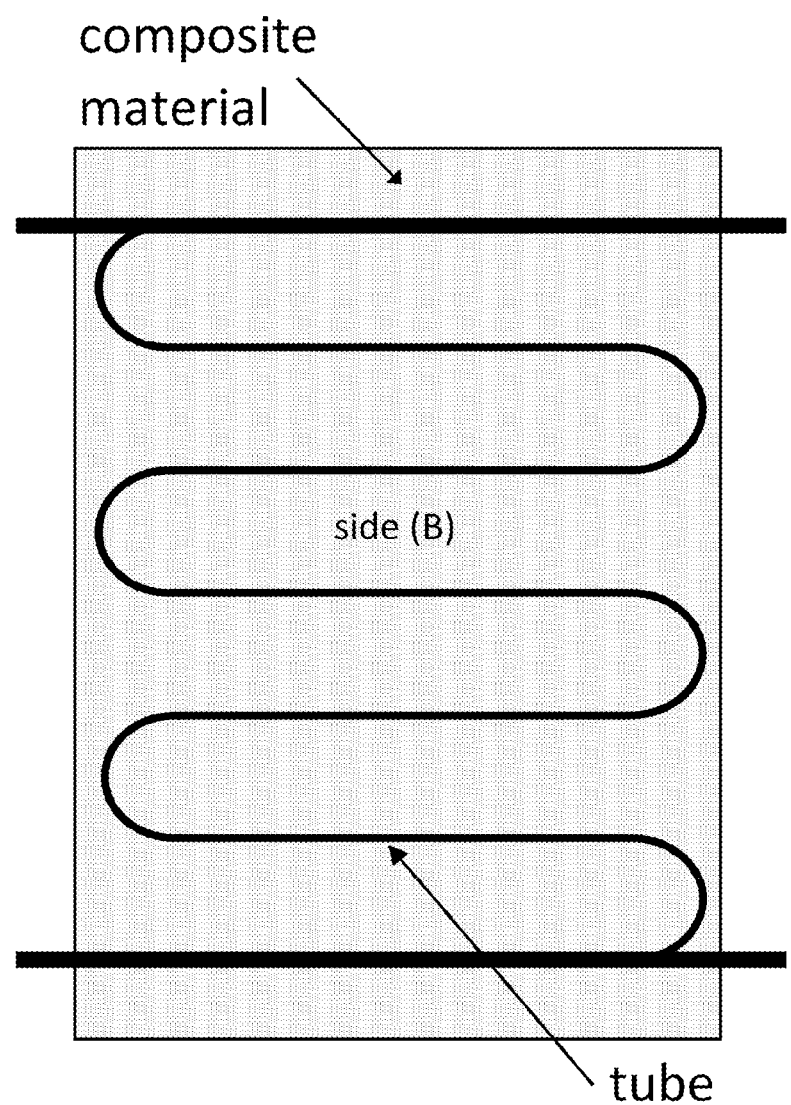

FIG. 14b schematically shows a composite material or solar wall or roof panel of the present invention with a serpentine geometry of attached tubes.

Figure 14C:
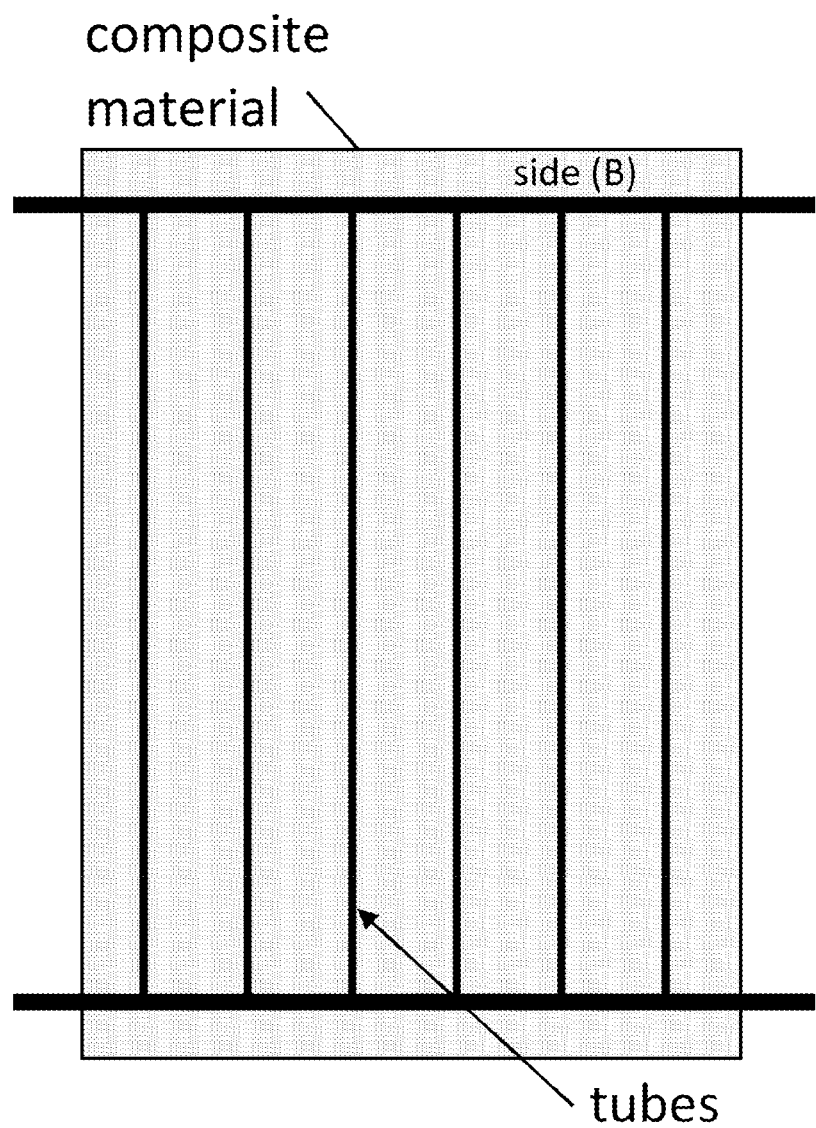

FIG. 14c schematically shows the composite material or solar wall or roof panel of the present invention with a harp-like geometry of attached tubes.

DETAILED DESCRIPTION

The composite material of the present invention is particularly suitable for an uncovered solar thermal absorber since it can withstand harsh and humid weather conditions for a long time when directly exposed to the environment, without a significant deterioration of its performance as solar thermal absorber over its usual lifetime while maintaining a good visual appearance. The composite material of the present invention can be mechanically deformed, perforated and/or embossed by standard mechanical working technologies without delamination or cracking of the coated layer system.

The carrier of the composite material according to the present invention is composed of high-purity aluminum, preferably having a purity of 99.5% or higher, an aluminum alloy, copper, electrolytic chromium coated steel (ECCS) (alternatively or formerly known as TFS (Tin Free Steel) steel) or stainless steel.

The high-purity aluminum and copper which can be used as the carrier material in the present invention has a very high integral reflection of greater than 95% in the wavelength range from 2.5 to 50 µm. In the present invention, the separate infrared reflective layer disclosed in EP 2 499 439 B1 can be dispensed with. It is replaced by a thin adhesion layer (2) having a thickness of 15 nm or less which is sufficiently transparent, so that the high reflection of high-purity aluminum or copper in the wavelength range from 2.5 to 50 µm becomes effective and thus a thermal emittance (100° C.) of less than 5% can be achieved. Electrolytic chromium coated steel (ECCS) (or TFS (Tin Free Steel) steel) and stainless steel have a lower reflection in the infrared range. Hence, though the thermal emission is higher, it is still smaller than 15% which is much less than for solar absorber panels in which lacquer layers or anodized aluminum surfaces are used.

As a further aspect of the present invention, the antireflection and protection layer (6) is designed to prevent a local color change due to wetting of the absorber surface with rainwater or condensation water and a deterioration of its appearance due to contamination with grease or oil such as from fingerprints etc. This is achieved by using a material having a refractive index of 1.8 or higher to 2.5 for the antireflection layer (6). In the present invention, the refractive index values refer to the visible wavelength range from 380 to 780 nm.

When an antireflection and protection layer with a refractive index of 1.8 or higher is used, it is necessary to replace the stoichiometric protective layer (6) disclosed in EP 2 499 439 B1 with a substoichiometric absorber layer (second absorber layer (5) in the present invention) in order to obtain a high degree of solar absorptance (>93%). Since the thermal load in an uncovered collector is much lower than in a covered collector, a stoichiometric protective layer located between the central absorber layer and the antireflection layer, like in EP 2 499 439 B1, is not necessary in the layer stack of the present invention to achieve sufficient heat stability. The antireflection and protection layer (6) provides enough protection against oxidic attack of the absorber layers. In any case, the claimed material shows sufficient resistance against thermal loads.

By forming a substoichiometric second absorber layer with a defined fraction of unsaturated metallic particles incorporated in the dielectric second absorber layer (5) (e.g. forming a cermet), the refractive index of the topmost absorber layer (5) can be increased, preferably in such a way that it is higher than the refractive index of the antireflective layer, so that an antireflection effect can be further enhanced to achieve a high solar absorptance and the visual color impression does not essentially change when the layer system is severely exposed to rainwater or contaminated (e.g. with grease).

Figure 2:
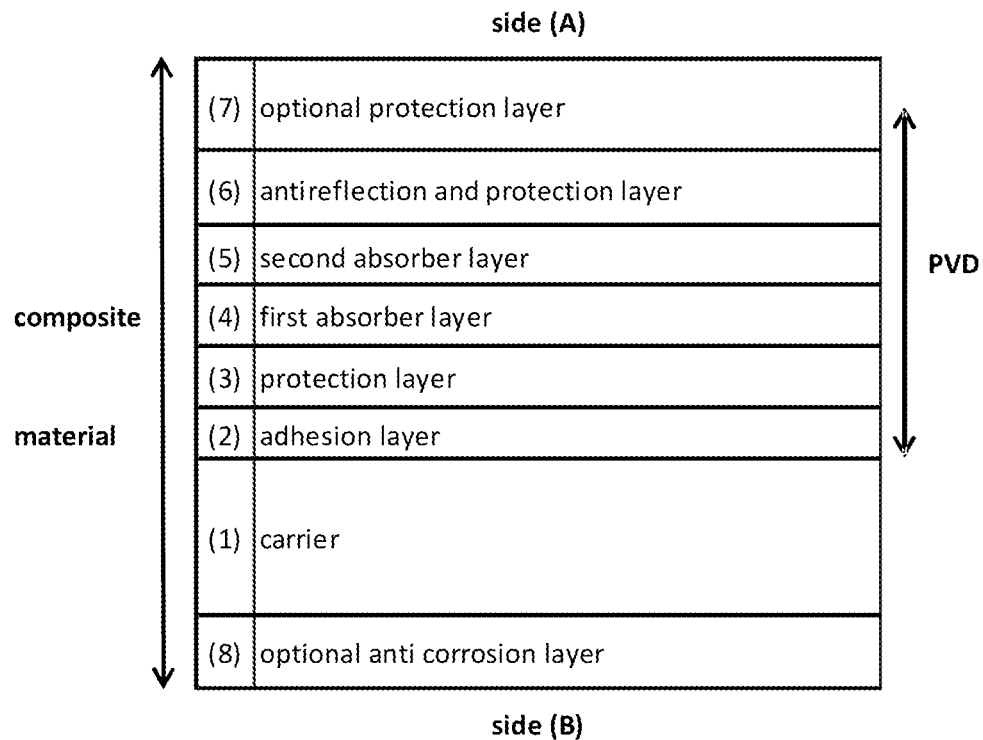

With reference to FIG. 2, the layer system on side (A) of the composite material facing the sun will be first described below.

The composite material of the present invention comprises an optically active system which comprises a multi-layer system of at least five layers (layers (2), (3), (4), (5), (6)) deposited on the optically active carrier (1) acting as an infrared mirror. The topmost layer (6) is a dielectric and/or oxidic antireflection and protection layer having a refractive index in the visible wavelength range (380 to 780 nm) from 1.8 to 2.5, and is selected from the group consisting of $ZrO_2$, Y-stabilized $ZrO_2$, $Cr_2O_3$, $Nb_2O_5$, $Si_3N_4$, $Y_2O_3$, $Ta_2O_5$, and a mixture of $ZrO_2$ and $Ta_2O_5$. All these materials have excellent stability against moisture and are very resistant to mechanical damage.

The lowermost layer (2) of the optically active system is an adhesion layer promoting the adhesion between the carrier (1) and the protection layer (3) and is composed of Cr, Ti, Ni, Mo, W, preferably Cr, Mo or Ni, alloys of two or more of these metals, or non-ferromagnetic nickel alloys with at least one metal selected from the group consisting of Cr, Al, V and Cu. The adhesion layer (2) has a thickness of 1 to 15 nm.

The central layers (4) and (5) are the actual absorber layers of the system; they are metal compounds having the composition $(Me_rAl_{1-r})O_xN_yC_z$, wherein Me represents at least one metal selected from titanium, zirconium and hafnium, wherein r is from 0.1 to 1.0, x is from 0 to 1.9, y is from 0 to 0.95, z is from 0 to 0.5 and x+y+z is from 0.5 to 1.9, or having the composition $(Cr_rAl_{1-r})O_xN_yC_z$, wherein r is from 0.1 to 1.0, x is from 0 to 1.4, y is from 0 to 0.95, z is from 0 to 0.5 and x+y+z is from 0.8 to 1.4.

The materials used for the first absorber layer (4) and the second absorber layer (5) can be present as cermets. Cermets ("ceramic metals") are materials where metallic particles, i.e. Ti, Zr, Hf and/or Cr in the present invention, or particles of a material with metallic properties (for instance CrN) with dimensions much smaller than the wavelength of the solar radiation are embedded in a dielectric matrix (for instance chromium oxide or aluminum nitride).

The composition of the absorber layers (4) and (5) differ in the present invention. Thereby, the refractive indices can be adjusted in such a way that, in combination with the antireflective layer (6), a high solar absorptance and a minimal color change of the overall layer system upon wetting by water or contamination (e.g. with grease) can be achieved.

A metal nitride and/or carbide layer (3), which is a nitride, carbonitride or carbide of a metal or of a mixture of two or more metals from subgroup IV, V or VI of the periodic system (i.e. T, Z, Hf, V, Nb, Ta, Cr, Mo, W), e.g. CrN, TiN or TiC, is located on the adhesion layer (2) and under the absorber layer (4). The metal nitride or carbide of the lower layer (3) is used as a barrier to suppress the diffusion of metal atoms from the carrier material (1). Furthermore, it is used as an anticorrosion layer for the surface of the carrier to maintain its high reflection. The layer (3) is therefore generally referred to as a protection layer in the present invention.

The optical properties of the layer system can be calculated by means of Fresnel's equations. The reflection spectra of the layer system can be calculated by means of a matrix method derived from Fresnel's equations, see cf., e.g., E. Hecht "Optik", Verlag Oldenburg 2001, ISBN 3-486-24917-7, p. 626-630.

The optically active multilayer system according to the present invention absorbs more than 90% of the solar radiation under AM 1.5 conditions (i.e. conditions of an air mass coefficient of 1.5—see ASTM G173-03) and a thermal emittance <5% is achieved in case aluminum or copper are used for the carrier material. In case of electrolytic chromium coated steel (ECCS) (or TFS (Tin Free Steel) steel) or stainless steel, the obtained thermal emittance is <15%. The solar absorptance and thermal emittance in the present invention are determined according to DIN ISO 22975-3: 2014 Annex A.

Figure 1:
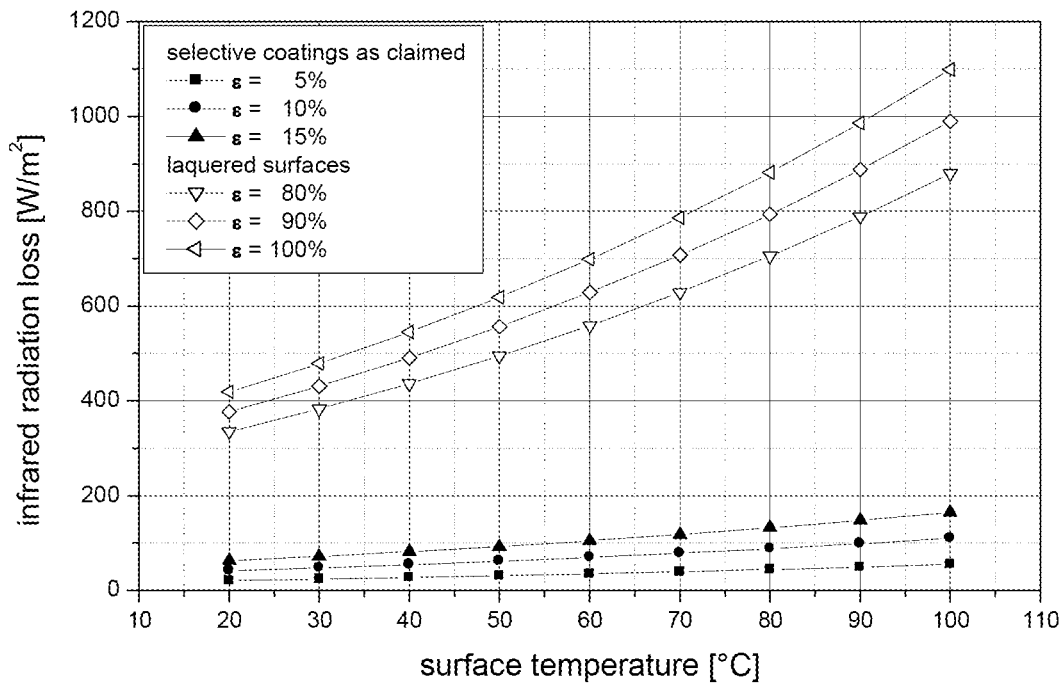

At higher surface temperatures in the range of around 30° C. to 50° C., the energy loss due to infrared radiation on side (A) of the panel is less than 100 W/m$^2$ in the present invention (see FIG. 1). The energy loss due to infrared radiation can be calculated from the Stefan Boltzmann equation for a given temperature using the thermal emittance measured according to DIN ISO 22975-3:2014 Annex A.

The composite material of the present invention is more stable against high humidity and the impact of water (wetting) on the absorber surface due to condensation and/or rainfall than the composite claimed in EP 2 499 439 B1. In addition, no significant color changes occur when wetted by water or contaminated by grease.

Embodiments of the layers of the composite material are described in more detail in the following.

Carrier (1):

The carrier (1) preferably has a thermal emittance according to DIN ISO 22975-3:2014 Annex A of less than 20%, preferably less than 15% or less than 10% and most preferably less than 5%.

The carrier (1) is preferably composed of aluminum having a purity of 99.5% or higher, copper having a purity of 99.5% or higher, or of one of the following aluminum alloys: EN AW 3103 (AlMn1), EN AW 3004 (AlMn1Mg1), EN AW 3104 (AlMn1Mg1Cu), EN AW 3005 (AlMn1Mg0, 5) and EN AW 5005 A (AlMg1 (C), or of one of the following stainless steels 1.4541 (AISI 321), 1.4404 (AISI 316L) and 1.4301 (AISI 304).

The carrier preferably has a thickness of 0.3 mm to 1.5 mm, preferably from 0.5 to 1.0 mm, more preferably from 0.5 to 0.8 mm.

Adhesion Layer (2):

The adhesion layer is directly located on the carrier and is preferably composed of chromium, molybdenum or a nickel-vanadium alloy.

The thickness of the adhesion layer is 1 to 15 nm preferably from 2 to 10 nm, more preferably in the range from 4 to 8 nm.

Protection Layer (3):

The protection layer (3) is preferably composed of CrN, or TiN most preferably CrN.

The thickness of the protection layer (3) is preferably from 10 to 50 nm, more preferably from 15 to 45 nm, even more preferably from 20 to 40 nm.

First Absorber Layer (4) and Second Absorber Layer (5):

The first absorber layer (4) and the second absorber layer (5) are composed of a metal compound having the composition $(Me_rAl_{1-r})O_xN_yC_z$, wherein Me represents at least one metal selected from titanium, zirconium and hafnium, wherein r is from 0.1 to 1.0, x is from 0 to 1.9, y is from 0 to 0.95, z is from 0 to 0.5 and x+y+z is from 0.5 to 1.9.

Preferably, r ranges from 0.2 to 0.7 or from 0.2 to 0.6, or more preferably from 0.3 to 0.5.

Alternatively, the first absorber layer (4) and the second absorber layer (5) are composed of a metal compound having the composition $(Cr_rAl_{1-r})O_xN_yC_z$, wherein r is from 0.05 to 1.0, x is from 0.9 to 1.4, y is from 0 to 0.5, z is from 0 to 0.5 and x+y+z is from 0.9 to 1.9, Preferably, r ranges from 0.2 to 0.7 or from 0.2 to 0.6, or more preferably from 0.3 to 0.5.

In preferred embodiments of the invention, the first absorber layer (4) and the second absorber layer (5) are composed of $CrO_xN_y$ or $(Ti_rAl_{1-r})O_xN_y$, wherein r is from 0.2 to 0.6, and x is from 0.9 to 1.9, y is from 0 to 0.5, and z is from 0 to 0.5. With regard to x, when the Al ratio is higher, i.e. r is low, x can preferably be adjusted to have a small value.

Even more preferably, the first absorber layer (4) is composed of $CrO_xN_y$, wherein x is from 0.8 to 1.4, preferably from 0.9 to 1.3, more preferably from 0.9 to 1.2, and y is from 0.02 to 0.4, preferably from 0.05 to 0.1, and the second absorber layer (5) is composed of $CrO_xN_y$, wherein x is from 1.0 to 1.4, preferably from 1.0 to 1.3, more preferably from 1.1 to 1.2, and y is from 0.02 to 0.4, preferably from 0.05 to 0.1.

In the present invention, the composition of the second absorber layer (5) is different from that of the first absorber layer (4), i.e. the layers are distinguishable. The compositions being different normally means that the indices x, y and z are different. Further, or alternatively, the type of metal and/or in case of $(Me_rAl_{1-r})O_xN_yC_z$ the ratio between the metal and Al may be different.

The thickness of the first absorber layer (4) is preferably from to 10 to 150 nm, more preferably from 20 to 100 nm, even more preferably from 30 to 70 nm.

Moreover, in case the first absorber layer (4) is composed of $CrO_xN_y$, the thickness of the absorber layer (4) is preferably from 20 to 50 nm, more preferably from 30 to 40 nm; and when the first absorber layer (4) is composed of $(Ti_rAl_{1-r})O_xN_y$, the thickness of the absorber layer (4) is preferably from 30 to 80 nm, more preferably from 40 to 70 nm.

The thickness of the second absorber layer (5) is preferably from to 10 to 150 nm, more preferably from 15 to 40 nm, even more preferably from 15 to 30 nm.

Moreover, in case the second absorber layer (5) is composed of $CrO_xN_y$, the thickness of the absorber layer (4) is preferably from 15 to 40 nm, more preferably from 15 to 30 nm; and when the second absorber layer (5) is composed of $(Ti_rAl_{1-r})O_xN_y$, the thickness of the absorber layer (4) is preferably from 15 to 40 nm, more preferably from 20 to 30 nm.

Antireflection and Protection Layer (6):

The antireflection and protection layer (6) has a refractive index of 1.8 or higher to 2.5 in the visible wavelength range from 380 to 780 nm, and is selected from the group consisting of $ZrO_2$, Y-stabilized $ZrO_2$, $Cr_2O_3$, $Nb_2O_5$, $Si_3N_4$, $Y_2O_3$, $Ta_2O_5$, and a mixture of $ZrO_2$ and $Ta_2O_5$. All these materials have excellent stability against moisture and are very resistant to mechanical damage. The antireflection and protection layer (6) is preferably composed of $ZrO_2$ or $Nb_2O_5$.

The thickness of the antireflection and protection layer (6) is preferably from to 20 to 150 nm, more preferably from 30 to 80 nm, even more preferably from 40 to 70 nm.

Optional Layer (7):

The composite material can be provided with a sol-gel protection layer (7) on the antireflection and protection layer (6), to further protect the layers (2) to (6) of the composite material against environmental impact. The thickness of the sol-gel protection layer should be small, in order to not significantly increase the thermal emittance of the composite material. The thickness is preferably less than 4 µm, further preferably 1 to 4 µm or 1 to 3 µm, even more preferably from 1.5 to 2.5 µm or 1.5 to 2 µm.

Optional Layer (8):

The reverse side (B) of the multilayer system according to the present application which is facing away from the sun may remain uncoated; alternatively, this side may also be coated (e.g. by a PVD, CVD or PECVD deposition method), preferably with an anticorrosion layer (8) composed of $ZrO_2$, $SiO_2$, $Al_2O_3$ or $Nb_2O_5$.

The optical parameters of this layer (8) are selected in such a way that the high reflection of the metallic carrier material in the infrared range is not severely reduced, e.g. less than 20%. Since this layer prevents corrosion of the metallic reverse side, the reflection essentially does not decrease even during prolonged use of the composite material in a solar collector. The heat radiation losses thus remain low and when used as a facade collector element, the infrared radiation emitted by the building wall is reflected again towards the wall (see FIG. 12, lower part). Thereby, heat losses of the building can be reduced by the composite material working as a heat mirror. In comparison, when a lacquered or anodized material is used with a high thermal emittance (corresponding to a high absorptance in the infrared range according Kirchhoff's law of thermal radiation) the infrared radiation from the building wall will be absorbed by the solar facade collector element and dissipated to the ambient) (see FIG. 12, upper part). The thickness of this layer is preferably from 20 to 400 nm, more preferably from 50 to 300 nm, even more preferably from 100 to 200 nm. Thus, the material can still be easily shaped without flaking or significant cracks in the protective layer.

Alternatively, or additionally, the side (B) can also be protected from corrosion by a lacquer layer or an adhesive film.

The composite material of the present invention can consist of the carrier (1) and the layers (2), (3), (4), (5) and (6) and optionally of one or both of the layers (7) and (8); i.e. no other layers are added or inserted in this case.

In case the composite material is to be used for solar activation of facade elements, a double-sided adhesive tape or preferably a transfer film with acrylic adhesive can be applied thereto.

This allows the composite material to be adhered directly onto the facade elements.

In a particularly preferred embodiment of the present invention, the composite material is as follows:

the carrier (1) is composed of aluminum having a purity of 99.5% or higher, and, on the side (A) of the carrier, the adhesive layer (2) is composed of chromium, the protection layer (3) is composed of CrN, the first absorber layer (4) is composed of $CrO_xN_y$, wherein x is from 0.9 to 1.2, and y is from 0.05 to 0.1, the second absorber layer (5) is composed of $CrO_xN_y$, wherein x is from 1.1 to 1.3, and y is from 0.05 to 0.1, and the antireflection and protection layer (6) is composed of $ZrO_2$ or $Nb_2O_5$.

In this embodiment, a sol-gel coating layer (7) can be present or not on top of the antireflection and protection layer (6), and the above-described layer (8) on the reverse side (B) of the composite material may be present or not.

The composite material according to the present invention can be produced in a conventional manner. For example, commercial PVD processes but, e.g., also CVD or PECVD processes, may be used to deposit the absorber layers and other layers according to the present invention. The antireflection and protection layer (6) is preferably coated by means of electron beam evaporation. The metal strip (carrier material) is moved in a vacuum chamber by means of a winding mechanism at constant strip velocity over different PVD coating stations, so that the individual layers of the multilayer system described can be successively applied to side (A) of the carrier material.

Before being coated, the metal strip may be stored as a roll. For coating, the strip can be unwound just before entering into the vacuum, coated and removed after the coating (batch process), or can be introduced into a vacuum from the atmosphere via a vacuum lock system, subjected to the coating process and then returned to the atmosphere via a second vacuum lock system (air to air process).

The metal strip preferably passes through one or more plasma cleaning stations prior to the coating in order to remove surface contaminations of the metal substrate (e.g., water, oils, greases, oxides) and thus to guarantee good adhesion of the multilayer system. A natural oxide layer on the carrier does not have to be removed but can be removed partly or completely. The carrier (1) should not have an anodically oxidized surface which typically has a thickness in the µm range in case of aluminum.

For example, magnetron sputtering, gas flow sputtering, ion beam sputtering, electron beam vapor deposition, thermal vapor deposition or arc vapor deposition may be used in the PVD processes. It is possible to use only one specific PVD process to apply the individual layers. Since a specific PVD process is usually especially well-suited for depositing specific materials, it is also possible to employ different PVD processes.

A reactive PVD process is usually used to deposit metal oxides, nitrides and/or carbides. A metal is deposited by means of one of the processes described, and oxygen and/or nitrogen and/or a carbon-containing gas is added into the PVD chamber via a gas distribution system at a defined flow rate, so that the metal forms the desired compound.

Preferably, reactive magnetron sputtering is used for as reactive PVD process. In case of using oxygen as reactive gas, the composition of the deposited layer can be automatically controlled by a Lambda sensor or in case of using a mixture of oxygen, nitrogen and/or a carbon containing gas by a Plasma-Emission-Monitoring (PEM) system.

The layer thickness of the individual layers can be controlled in a known manner by varying either the velocity of the strip or the power introduced into the individual PVD coating stations. The rate of deposition can be controlled and regulated according to different methods. Reflectometry, ellipsometry, crystal methods or X-ray fluorescence methods, etc., are used industrially for this and can be applied in the present invention.

The optically active layer on side (B) of the carrier material may be applied by one of the above-described PVD (also CVD and PECVD) processes.

The present invention also relates to a solar radiation absorbent wall panel or roof panel comprising the composite material according to the invention or consisting thereof.

Such wall panels or roof panels can advantageously be used as solar thermal absorbers for heating the inside of buildings. A typical system for heating buildings for which the wall panels or roof panels according to the invention can be applied is shown in FIG. 11.

The panels are used to heat ambient air, the heated air is conducted in channels formed by the panels or attached to the panels and is then transferred to the inside of a building by a fan or the like.

For heating ambient air and conducting the air, the panels according to the invention advantageously have a shape defining a space, such as a channel, allowing heated air to be collected and conducted, said space being surrounded by the side (B) of said composite material.

Moreover, the panels advantageously have a plurality of air inlet openings, preferably in the form of slits or holes, to allow ambient air heated by the surface of the panels of the invention to pass through the openings from side (A) to side (B) of the composite material. Preferably, this is aided by a ventilation device such as a fan which preferably establishes a defined flow rate for the heated air. Preferably, the air inlet openings are distributed homogeneously in the surface of the panel to generate a homogeneous air flow over the surface of the panel to allow a controlled and efficient heat transfer from the panel to the ambient air.

In preferred embodiments of the invention, the panels of the invention are provided with a ventilation stack mounted on side (B) of the composite material and communicating with the inside of a building, allowing heated air to be supplied to the inside of the building. In FIG. 11, the ventilation stack is arranged downstream of the fan.

Figure 8:
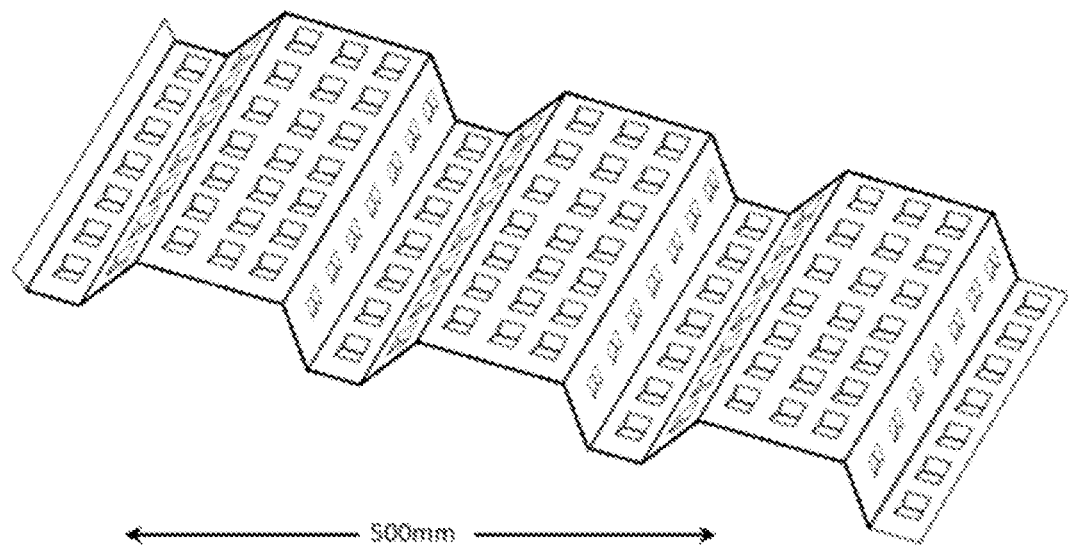
FIG. 8 to 10 show different shapes of a solar-radiation absorbent wall panel or roof panel according to embodiments of the present invention with different types of air inlet openings.
Figure 9:
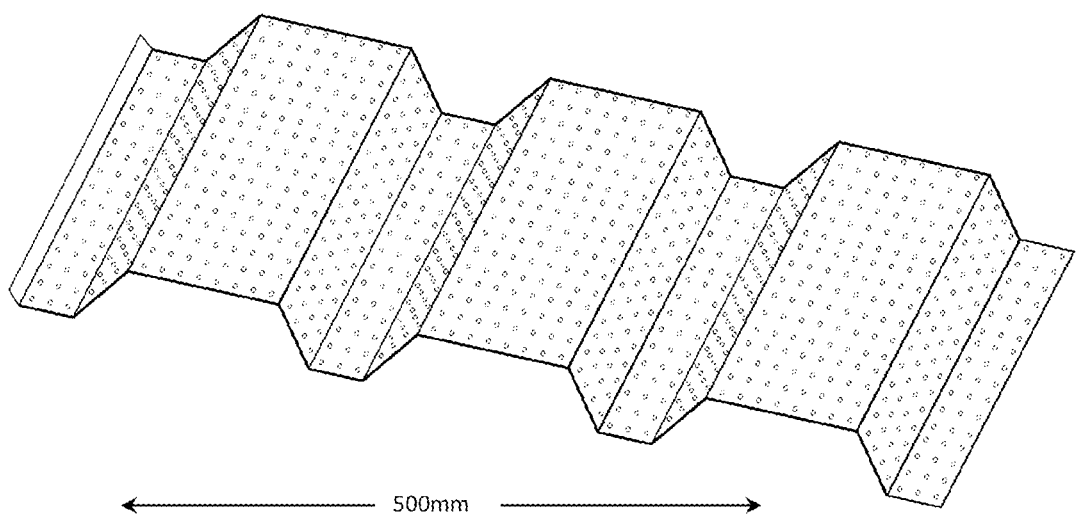
Figure 10:
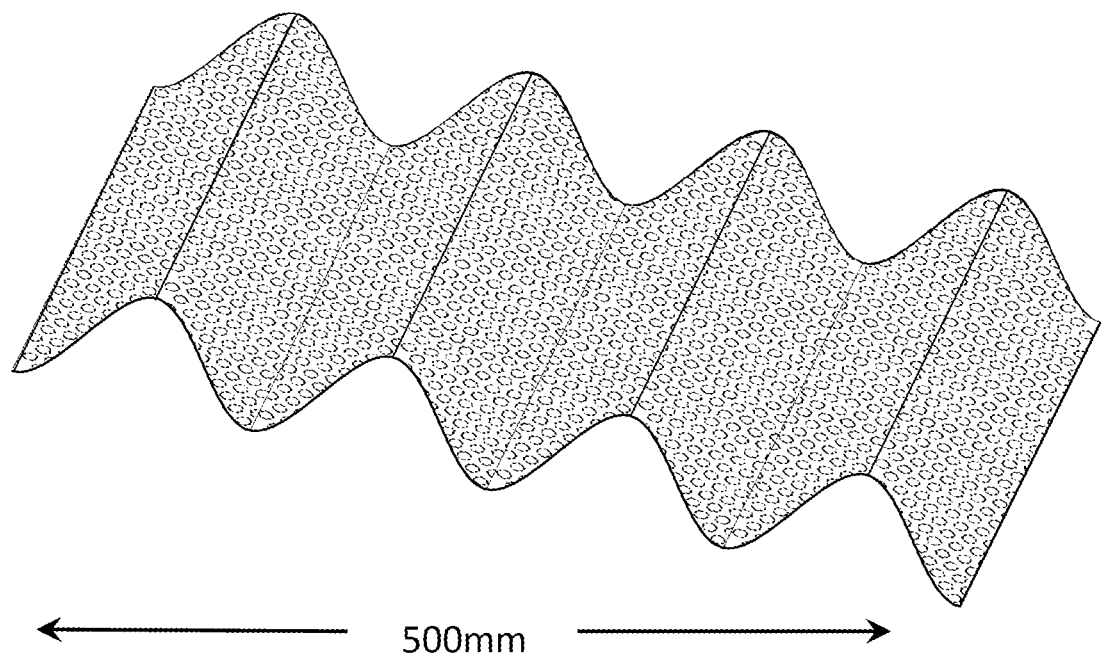

In preferred embodiments of the invention the solar radiation absorbent wall or roof panel according the present invention has a shape defining a space to receive ambient air to be heated. To this end, the panel advantageously has the shape of a trapezoidal sheet as shown in FIGS. 8 and 9 or a corrugated sheet as shown in FIG. 10. Suitable shapes applicable for the wall or roof panels of the present invention are disclosed for example in DIN 18807 (1987). Suitable shapes are also disclosed, for example, in US 2005/0252507 A1.

To obtain the panels of the present invention, the composite material can be mechanically deformed, typically by roll forming or deep drawing, to form a trapezoidal or corrugated sheet. Perforations for the use as air inlet openings can be formed by standard methods such as punching, drilling, milling or laser-cutting.

In other embodiments of the invention, the side (B) of the composite material or the solar radiation absorbent wall panels or roof panels can be attached to a facade or roof element by means of an adhesive tape, whereby a panel for solar thermal activation is formed. In such embodiments, the wall panels or roof panels or the composite material do not have to be shaped to form spaces for the conduction of air. Instead, as shown in FIG. 13, the heat is transferred directly to a facade element or roof element of the building. Preferably the facade element for solar thermal activation comprises concrete, and an array of pipes, tubes or conduits is integrated in the concrete. This allows the extraction of thermal energy from the composite material via the facade element material to a fluid (gas, preferably air, or a liquid) in the tubes (see FIG. 13).

In further embodiments of the present invention, the solar radiation absorbent wall panels or roof panels or the composite material can be provided with pipes, tubes or conduits which are attached on side (B) of the composite material allowing heating of a fluid circulating in the pipes, tubes or conduits (see FIG. 14$a$). The tubes or conduits can be arranged in a serpentine geometry (see FIG. 14$b$) or a harp-like geometry (see FIG. 14$c$). These tube geometries allow the connection of the tubes of several panels to form a solar facade or solar roof.

Typically, said pipes, tubes or conduits are attached by welding, soldering, laser welding or ultrasonic welding. When needed, the heat can be withdrawn from the pipes/tubes/conduits and can, for example, be used in combination with a heat pump, to heat buildings.

The present invention further relates to a solar facade or roof, comprising solar radiation absorbent wall panels or roof panels according to the invention, wherein preferably a plurality of the panels are arranged so as to overlap with respective adjacent panels to form a solar absorbent facade or roof.

The present invention also relates to a method for heating and ventilating buildings comprising heating ambient air and supplying the heated air to a building, wherein the solar radiation absorbent wall panel or roof panel according to the present invention is used.

In a method according to an embodiment of the invention, the ambient air heated by the surface of the wall panels or roof panels exposed to solar radiation is sucked through the air inlet openings of the absorber panel by a ventilation device such as a fan and is then blown into a building.

For solar absorber panels with a high thermal emittance (for instance lacquered or anodized panels) used as facade solar air collectors, the efficiency of the system or method is high (more than 70%) with an air flow rate higher than 6 cubic feet per minute per square feet absorber area (6 cfm/ft$^2$=110 m$^3$/h/m$^2$) (see US 2005/0252507 A1, page 1, section [0006]), because in this case the air sucked through the panel cools the panel to a surface temperature of less than 20° C. where the infrared radiation losses are low (see FIG. 1). At lower air flow rates, the efficiency of prior art systems decreases significantly because the surface temperature of the absorber panels rises to temperatures where the infrared radiation losses become significant.

However, with the selective solar radiation energy absorbent composite material of the present invention, the radiation losses even at higher surface temperatures of the panel can be kept at a low level (less than 100 W/m, see FIG. 1), because of the low thermal emittance of the material. Thus, it is possible to achieve a high efficiency of heat transfer even at low flow rates (around 60% at a flow rate of 2 cfm/ft$^2$=36 m$^3$/h/m$^2$). Additionally, it is possible to achieve a temperature increase up to 50° C. above ambient air temperature at a low flow rate of e.g. 2 cfm/ft$^2$=36 m$^3$/h/m$^2$ at a solar radiation of 1000 W/m$^2$.

EXAMPLES

Example 1a

An aluminum strip (aluminum of 99.5%-99.8% purity) having a thickness of 0.7 mm and a width of 1250 mm, which has been degreased by chemical purification and passivated, was used as carrier material.

This pretreated aluminum strip was subsequently coated with a commercial air to air strip coating unit. Such strip coating units are described, for example, in the series "Vakuumbeschichtung", Volume 5, pp. 187-199, VDI-Verlag 1993, editor: Gerhard Kienel, ISBN 3-18-401315-4.

The aluminum strip entered the vacuum chamber via a plurality of strip locks and then passed through a plurality of plasma cleaning stations. The strip was subsequently fed through a plurality of magnetron sputtering stations, which were separated from one another by flat locks.

A chromium layer having a thickness of 5 nm, which forms the adhesion layer (2), was applied by sputtering in the first sputtering station.

A CrN layer having a thickness of 35 nm was deposited in the next sputtering station by reactive sputtering of chromium with defined addition of nitrogen; this CrN layer forms the protection layer (3).

A substoichiometric $CrO_{1.0}N_{0.08}$, layer having a thickness of 36 nm which formed the first absorber layer (4), was deposited in the next sputtering station by reactive sputtering of chromium with defined addition of an oxygen-nitrogen mixture. The composition was automatically controlled by a lambda sensor.

Another substoichiometric $CrO_{1.2}N_{0.08}$, layer having a thickness of 26 nm which formed the second absorber layer (5), was deposited in the next sputtering station by reactive sputtering of chromium with defined addition of an oxygen-nitrogen mixture. The composition was automatically controlled by a lambda sensor.

The sputtering processes took place in a pressure range of 1e-3 to 6e-3 mbar. Argon was used as sputtering gas.

After passing another flat lock, the strip entered an electron beam vapor deposition chamber. In this chamber, $ZrO_2$ was vapor-deposited by means of electron beam technology. During the process oxygen was added in a defined manner, so that a working pressure in the range of 1e-4 to 6e-4 mbar was adjusted. The $ZrO_2$ layer applied in this process formed the antireflection and protection layer (6) of the multilayer system and had a thickness of 60 nm.

The layer thicknesses of the individual layers of the multilayer system were determined and controlled by means of ellipsometer systems.

The strip was subsequently returned to the atmosphere through a multistage strip lock and was then wound up.

Figure 3:
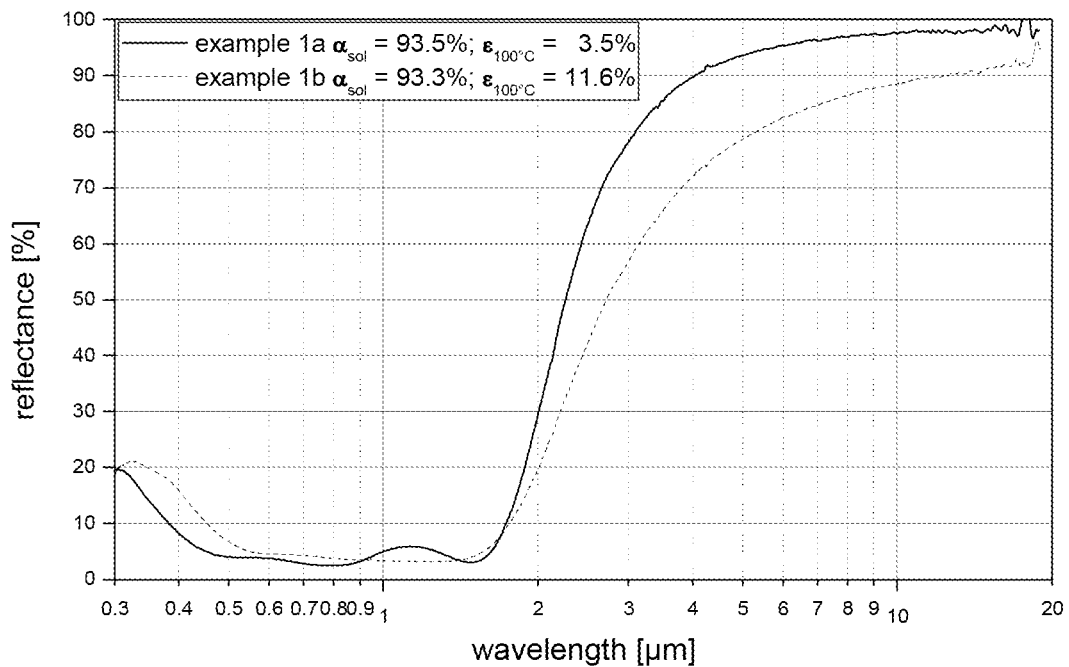

FIG. 3 shows the reflection spectrum, the solar absorptance and the thermal emittance (at 100° C.) of this material.

This composite material was subjected to an outdoor weathering test. The material was fixed horizontally with the coating side (A) facing the sky on a weathering test stand located in Bernburg, Germany, and exposed to the weather without protection for 3 years.

Figure 4:
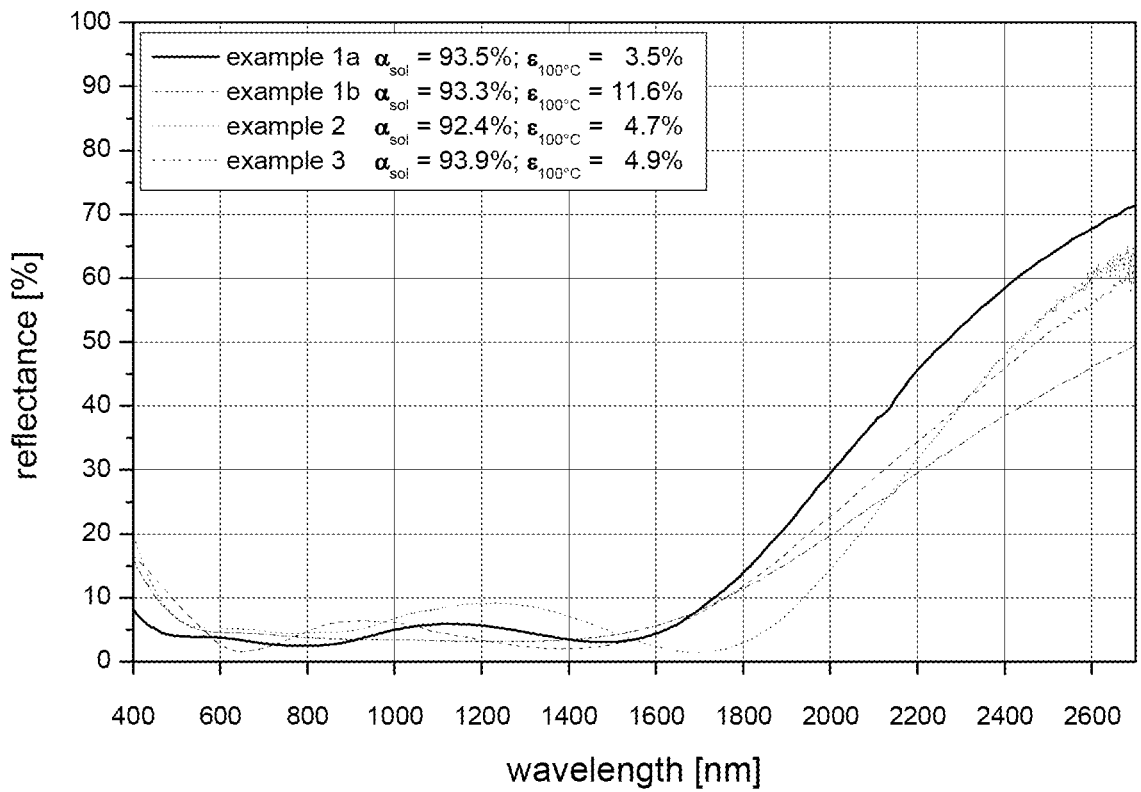

FIG. 4 shows the reflection spectrum, absorptance in its original state and after 3 years of weathering. The optical characteristics of the composite material essentially did not change. No signs of corrosion were observed.

In addition, the composite materials have been tested with regards to their stability against high humidity and the occurrence of water on the absorber surface due to condensation and/or rainfall as expected in an uncovered facade solar collector over a lifetime of 20 years. The tests performed were based on the methodology developed within Task 10 of the IEA SHC Program (Carlsson, B., Frei, U., Köhl, M., Möller, K.; 1994. Accelerated Life Testing of Solar Energy Materials—Case Study of some Selective Solar Absorber Coating Materials for DHW Systems; A report of IEA Task X; Solar Materials Research and Development; SP Report 94:13; ISBN91-7848-472-3.) and an outdoor load profile as determined for absorber surfaces applied in uncovered solar facade collectors located in Zurich, Switzerland (Dudita, M., Zenhausern, D., Mojic, I., Thissen, B., Brunold, S.; 2016. Durability of Spectrally Selective Absorber Coatings Used for Unglazed Solar Thermal Collectors; EuroSun 2016/ISES Conference Proceedings 2076.). In order to simulate the determined high humidity and wetting load within a reasonable period, the effect of humidity and wetting was tested with condensation on the absorber surface at temperatures of 70 and 80° C., in contrast to the test according to IEA-SHP, DIN ISO 22975-3 for covered solar collectors, where the test temperatures are 40° C. or 60° C. Therefore, constant load condensation tests have been performed in a climate chamber with two composite material samples in parallel at 75° C. air temperature with 95% relative humidity and 70° C. sample temperature up to 1900 h and at 85° C. air temperature with 95% relative humidity and 80° C. sample temperature up to 807 h.

Figure 6:
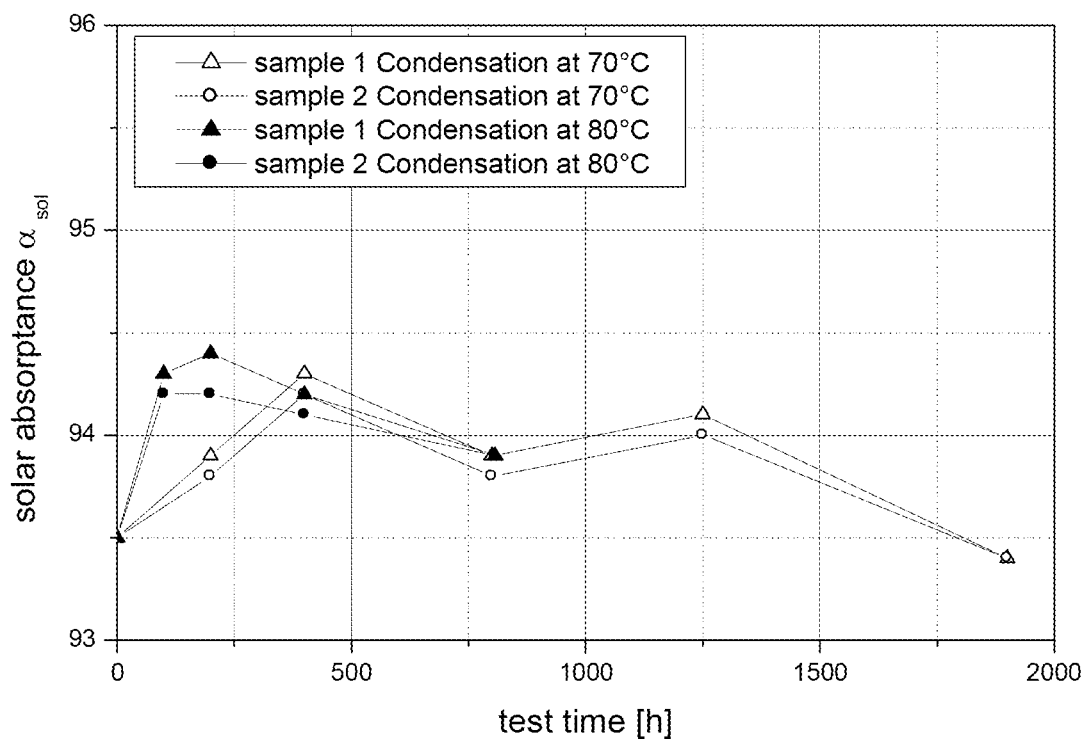
FIG. 6 shows the solar absorptance of two samples of a selective absorber material of the present invention according Example 1a in condensation tests at 70° C. and 80° C. over the test time.

FIG. 6 shows the degradation results for solar absorptance. No significant change of the solar absorptance at both test temperatures was observed over the test time.

Figure 7:
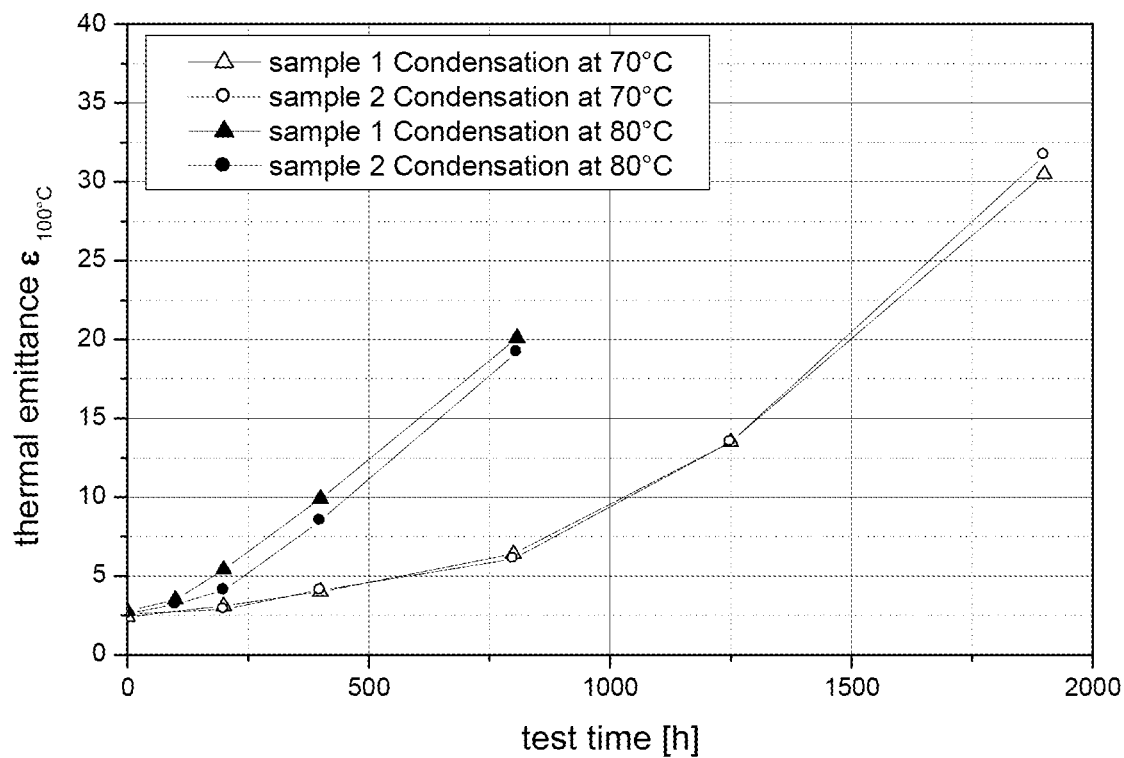
FIG. 7 shows the thermal emittance of two samples of a selective absorber material of the present invention according Example 1a in condensation tests at 70° C. and 80° C. over the test time.

FIG. 7 shows that the thermal emittance increases over the test time. The activation energy of the degradation process can be estimated from the different rates of degradation of the thermal emittance at the two test temperatures by using a method derived from the Arrhenius law (described in IEA-SHP, DIN ISO 22975-3). Based on the activation energy and the load profile, it was possible to estimate a lifetime of the composite material as a facade collector of more than 30 years.

Figure 5A:
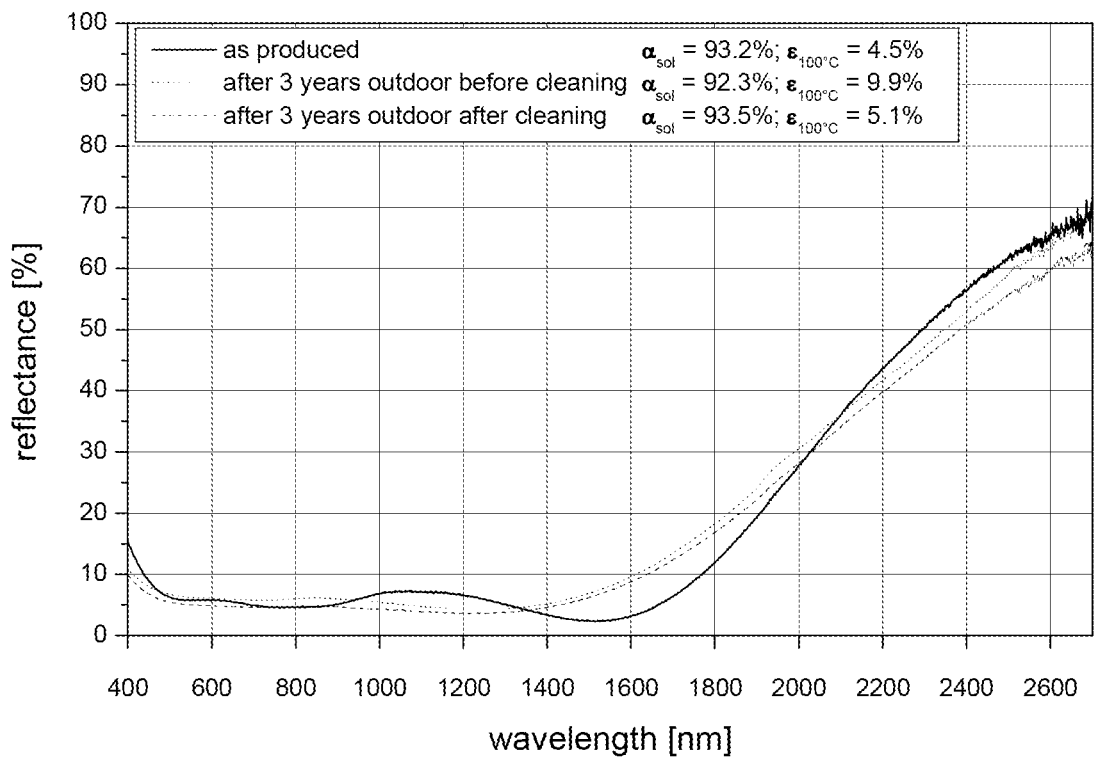
FIG. 5a shows the reflectance spectra of a selective absorber material according to Example 1a of the present invention before and after three years of exposure to the environment (Bernburg, Germany).
Figure 5B:
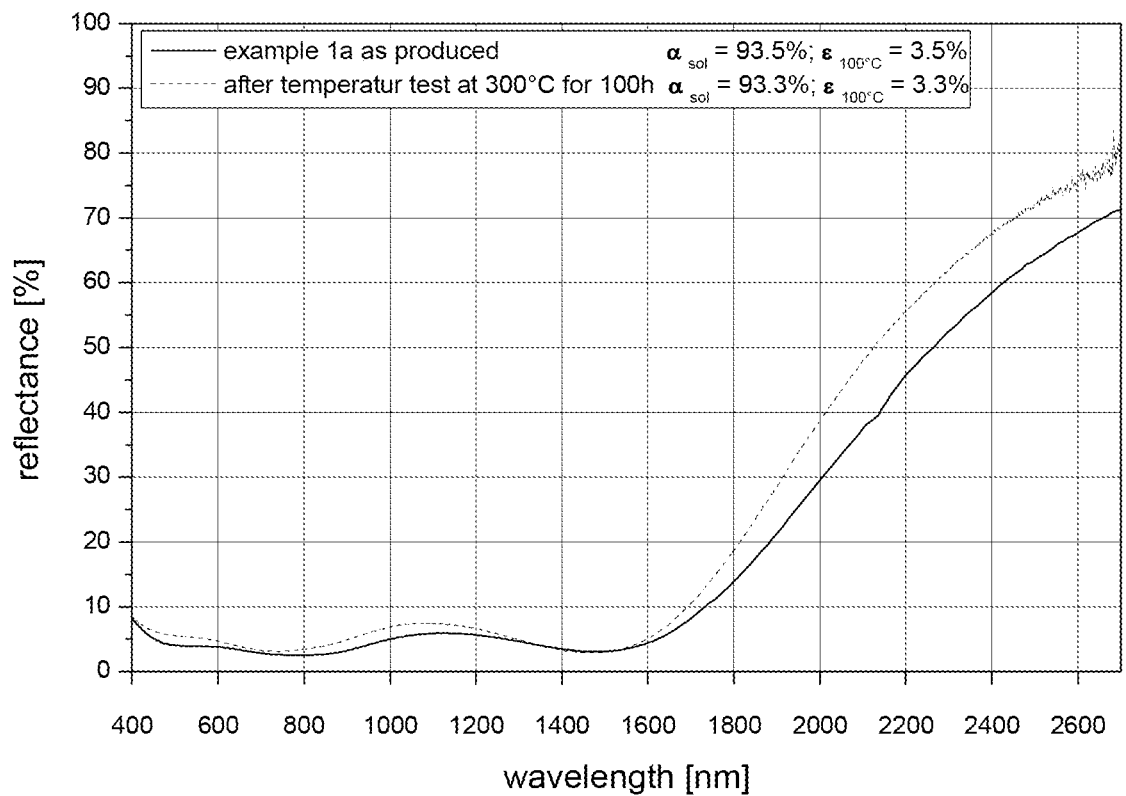
FIG. 5b shows the reflection spectra of the material according to Example 1a before and after a temperature test a 300° C. for 100 hrs. No significant change in the optical properties was observed.

Additionally, FIG. 5b shows the reflection spectra of the material according Example 1a and after a temperature test a 300° C. for 100 hrs. No significant change of the optical properties was observed. This means that the material shows a good heat resistance.

The obtained absorber strip was laminated with a protective film, further processed into a panel by punching to form regular air inlet openings and subsequent roll forming to obtain a panel as shown in FIG. 8. After punching and roll forming, no surface deterioration due to the mechanical processing was observed.

The obtained facade element shows an infrared radiation loss of less than 100 W/m, calculated using the Stefan Boltzmann equation and the thermal emittance measured according to DIN ISO 22975-3:2014 Annex A, up to a surface temperature of 100° C.

Example 1b

A stainless steel (EN 14541; AISI 321) strip having a thickness of 0.6 mm and a width of 1250 mm, which has been degreased by chemical purification is used as carrier material.

This pretreated stainless steel strip was subsequently coated with a commercial air to air strip coating unit.

The stainless steel strip entered the vacuum chamber via a plurality of strip locks and then passes through a plurality of plasma cleaning stations. The strip was subsequently fed through a plurality of magnetron sputtering stations which were separated from one another by flat locks.

A chromium layer having a thickness of 5 nm, which formed the adhesion layer (2), was applied by sputtering in the first sputtering station.

A CrN layer having a thickness of 34 nm was deposited in the next sputtering station by reactive sputtering of chromium with defined addition of nitrogen; this CrN layer formed the protective layer (3).

A substoichiometric $CrO_{1.0}N_{0.08}$, layer having a thickness of 32 nm which formed the first absorber layer (4), was deposited in the next sputtering station by reactive sputtering of chromium with defined addition of an oxygen-nitrogen mixture. The composition was automatically controlled by a lambda sensor.

Another substoichiometric $CrO_{1.2}N_{0.08}$, layer having a thickness of 24 nm which formed the second absorber layer (5), was deposited in the next sputtering station by reactive sputtering of chromium with defined addition of an oxygen-nitrogen mixture. The composition was automatically controlled by a lambda sensor.

The sputtering processes took place in a pressure range of 1e-3 to 6e-3 mbar. Argon was used as sputtering gas.

After passing another flat lock, the strip entered an electron beam vapor deposition chamber. In this chamber $ZrO_2$ was vapor-deposited by means of electron beam technology. During the process oxygen was added in a defined manner, so that a working pressure in the range of 1e-4 to 5e-4 mbar was adjusted. The $ZrO_2$ layer applied in this process formed the antireflection and protection layer (6) of the multilayer system and had a thickness of 68 nm.

The layer thicknesses of the individual layers of the multilayer system were determined and controlled by means of ellipsometer systems.

The strip was subsequently returned to the atmosphere through a multistage strip lock and was then wound up.

FIG. 3 shows the reflection spectra, the solar absorptance and the thermal emission (100° C.) of this material.

This material also showed excellent humidity and corrosion stability. The material could be deformed by deep drawing and roll forming without damage of the coating.

Example 2

An aluminum strip (aluminum of 99.5%-99.8% purity) having a thickness of 0.7 mm and a width of 1250 mm, which has been degreased by chemical purification and passivated, was used as carrier material.

This pretreated aluminum strip was subsequently coated with a commercial air to air strip coating unit. The aluminum strip entered the vacuum chamber via a plurality of strip locks and then passed through a plurality of plasma cleaning stations. The strip was subsequently fed through a plurality of magnetron sputtering stations which are separated from one another by flat locks.

A chromium layer having a thickness of 5 nm, which formed the adhesion layer (2), was applied by sputtering in the first sputtering station.

A CrN layer having a thickness of 31 nm was deposited in the next sputtering station by reactive sputtering of chromium with defined addition of nitrogen; this CrN layer formed protective layer (3).

A substoichiometric $CrO_{1.0}N_{0.08}$, layer having a thickness of 34 nm which formed the first absorber layer (4), was deposited in the next sputtering station by reactive sputtering of chromium with defined addition of an oxygen-nitrogen mixture. The composition was automatically controlled by a lambda sensor.

Another substoichiometric $CrO_{1.1}N_{0.05}$, layer having a thickness of 16 nm which formed the second absorber layer (5), was deposited in the next sputtering station by reactive sputtering of chromium with defined addition of an oxygen-nitrogen mixture. The composition was automatically controlled by a lambda sensor.

After passing another flat lock, the strip entered a set of subsequent sputtering stations provided with niobium oxide targets where $Nb_2O_5$ is sputtered adding oxygen. The $Nb_2O_5$ layer applied in this process formed the antireflection and protection layer (6) of the multilayer system and had a thickness of 55 nm.

The sputtering processes took place in a pressure range of 1e-3 to 6e-3 mbar. Argon was used as sputtering gas.

The layer thicknesses of the individual layers of the multilayer system were determined and controlled by means of ellipsometer systems.

The strip was subsequently returned to the atmosphere through a multistage strip lock and was then wound up.

FIG. 4 shows the reflection spectrum, the solar absorptance and the thermal emission (100° C.) of this material. For comparison, the spectra of examples 1a, 1b and 3 are also shown.

On side (B) of the composite material according example 2 an adhesive tape was laminated to attach the composite material to facade elements for solar thermal activation.

Example 3

An aluminum strip (aluminum of 99.5%-99.8% purity) having a thickness of 0.7 mm and a width of 1250 mm, which has been degreased by chemical purification and passivated, was used as carrier material.

This pretreated aluminum strip was subsequently coated with a commercial air to air strip coating unit. The aluminum strip entered the vacuum chamber via a plurality of strip locks and then passed through a plurality of plasma cleaning stations. The strip was subsequently fed through a plurality of magnetron sputtering stations, which were separated from one another by flat locks.

A titanium layer having a thickness of 5 nm, which formed the adhesion layer (2), was applied by sputtering in the first sputtering station.

A TiN layer having a thickness of 20 nm was deposited in the next sputtering station by reactive sputtering of titanium with defined addition of nitrogen; this TiN layer formed protective layer (3).

A substoichiometric $Ti_{0.3}Al_{0.7}N_{0.85}$, layer having a thickness of 68 nm which formed the first absorber layer (4), was deposited in the next sputtering station by reactive sputtering of TiAl with defined addition of nitrogen.

Another substoichiometric $Ti_{0.3}Al_{0.7}N_{0.95}$, layer having a thickness of 24 nm which formed the second absorber layer (5), was deposited in the next sputtering station by reactive sputtering of TiAl with defined addition of nitrogen.

The sputtering processes took place in a pressure range of 1e-3 to 6e-3 mbar. Argon was used as sputtering gas.

After passing another flat lock, the strip entered an electron beam vapor deposition chamber. In this chamber, $ZrO_2$ was vapor-deposited by means of electron beam technology. During the process oxygen was added in a defined manner, so that a working pressure in the range of 1e-4 to 6e-4 mbar was adjusted. The $ZrO_2$ layer applied in this process formed the antireflection and protection layer (6) having a thickness of 55 nm of the multilayer system.

The layer thicknesses of the individual layers of the multilayer system were determined and controlled by means of ellipsometer systems.

The strip was subsequently returned to the atmosphere through a multistage strip lock and was then wound up.

FIG. 4 shows the reflection spectrum, the solar absorptance and the thermal emission (100° C.) of this material. For comparison, the spectra of examples 1a, 1b and 2 are also shown.

The obtained absorber strip was laminated with a protective film, further processed into a panel by punching to form regular air inlet openings and subsequent roll forming to obtain a panel as shown in FIG. 8. After punching and roll forming, no surface deterioration due to the mechanical processing was observed.

The examples show the composite material according to the invention is suitable for uncovered solar facade and roof panel applications.

The following Table 1 summarizes the experiments.

TABLE 1

| Example No. | α sol [%] | ε 100° C. [%] | (1) carrier | (2) adhesion layer material | thickness [nm] | (3) protection layer material | thickness [nm] | (4) first absorber layer material | thickness [nm] | (5) second absorber layer material | thickness [nm] | (6) antireflection and protection layer material | thickness [nm] |
|---|---|---|---|---|---|---|---|---|---|---|---|---|---|
| 1a | 93.5 | 3.5 | Al EN 1080 H18 | Cr | 5 | CrN | 35 | $CrO_{1.0}N_{0.08}$ | 36 | $CrO_{1.2}N_{0.08}$ | 26 | $ZrO_2$ | 60 |
| 1b | 93.3 | 11.6 | SS EN 1.4541; AISI 321 | Cr | 5 | CrN | 34 | $CrO_{1.0}N_{0.08}$ | 32 | $CrO_{1.2}N_{0.08}$ | 24 | $ZrO_2$ | 68 |
| 2 | 92.4 | 4.7 | Al EN 1080 H18 | Cr | 5 | CrN | 31 | $CrO_{1.0}N_{0.05}$ | 34 | $CrO_{1.1}N_{0.05}$ | 16 | $Nb_2O_5$ | 45 |
| 3 | 93.9 | 4.9 | Al EN 1080 H18 | Ti | 5 | TiN | 20 | $Ti_{0.3}Al_{0.7}N_{0.85}$ | 68 | $Ti_{0.3}Al_{0.7}N_{0.95}$ | 24 | $ZrO_2$ | 55 |

The invention claimed is:

1. A composite material for conversion of solar radiation to heat, comprising:
    a carrier comprising a first side and a second side, composed of aluminum, an aluminum alloy, copper, electrolytic chromium coated steel (ECCS) or stainless steel, wherein at least the following layers are present on the first side of the carrier in the following order:
    an adhesion layer composed of chromium, titanium, nickel, molybdenum, tungsten, alloys of two or more of these metals, or a non-ferromagnetic nickel alloy with at least one metal selected from the group consisting of chromium, aluminum, vanadium and copper, having a thickness of 1 to 15 nm, on the carrier,
    a protection layer composed of a nitride, a carbide or a carbonitride of a metal or a mixture of two or more metals from subgroups IV, V or VI of the periodic system, on the adhesion layer,
    a first absorber layer of a metal compound having a composition $(Me_rAl_{1-r})O_xN_yC_z$, wherein Me represents at least one metal selected from titanium, zirconium and hafnium, wherein r is from 0.1 to 1.0, x is from 0 to 1.9, y is from 0 to 0.95, z is from 0 to 0.5 and x+y+z is from 0.5 to 1.9, or a composition $(Cr_rAl_{1-r})O_xN_yC_z$, wherein r is from 0.1 to 1.0, x is from 0 to 1.4, y is from 0 to 0.5, z is from 0 to 0.95 and x+y+z is from 0.8 to 1.4, on the protection layer,
    a second absorber layer of a metal compound having the composition $(Me_rAl_{1-r})O_xN_yC_z$ or $(Cr_rAl_{1-r})O_xN_yC_z$, as defined for the first absorber layer, on the first absorber layer, wherein the composition is different from that in the first absorber layer, and
    a protection layer that is at least one of dielectric and/or oxidic antireflection, and having a refractive index from 1.8 to 2.5 in the visible wavelength range from 380 nm to 780 nm, which is selected from the group consisting of $ZrO_2$, Y stabilized $ZrO_2$, $Cr_2O_3$, $Nb_2O_5$, $Si_3N_4$, $Y_2O_3$, $Ta_2O_5$, and a mixture of $ZrO_2$ and $Ta_2O_5$, on the second absorber layer.

2. The composite material according to claim 1, wherein the carrier is composed of aluminum having a purity of 99.5% or higher, copper having a purity of 99.5% or higher, or of one of the following aluminum alloys: EN AW 3103 (AlMn1), EN AW 3004 (AlMn1Mg1), EN AW 3104 (AlMn1Mg1Cu), EN AW 3005 (AlMn1Mg0,5) and EN AW 5005 A (AlMg1 (C), or of one of the following stainless steels 1.4541 (AISI 321), 1.4404 (AISI 316L) or 1.4301 (AISI 304).

3. The composite material according to claim 1, wherein at least one of:
    the adhesion layer is composed of chromium, molybdenum or a nickel-vanadium alloy,
    the protection layer is composed of CrN, CrC, CrCN, TiN or TiC,
    the first absorber layer is composed of $CrO_xN_yC_z$ or $(Ti_rAl_{1-r})O_xN_yC_z$, wherein r is from 0.2 to 0.7,
    the second absorber layer is composed of $CrO_xN_yC_z$ or $Ti_rAl_{1-r})O_xN_yC_z$, wherein r is from 0.2 to 0.7, or
    the antireflection and protection layer is composed of $ZrO_2$ or $Nb_2O_5$.

4. The composite material according to claim 3, wherein the first absorber layer is composed of $CrO_xN_y$, wherein x is from 0.8 to 1.4, and y is from 0.02 to 0.4.

5. The composite material according to claim 3, wherein the second absorber layer is composed of $CrO_xN_y$, and wherein x is from 1.0 to 1.4, and y is from 0.02 to 0.4.

6. The composite material according to claim 1, further comprising a sol-gel protection layer having a thickness less than 4 μm on the antireflection and protection layer.

7. The composite material according to claim 1, wherein:
    the carrier is composed of aluminum having a purity of 99.5% or higher,
    the adhesive layer is composed of chromium,
    the protection layer is composed of CrN,
    the first absorber layer is composed of $CrO_xN_y$, wherein x is from 0.9 to 1.2, and y is from 0.05 to 0.1,
    the second absorber layer is composed of $CrO_xN_y$, wherein x is from 1.1 to 1.3, and y is from 0.05 to 0.1, and
    the antireflection and protection layer is composed of $ZrO_2$ or $Nb_2O_5$.

8. The composite material according claim 1, wherein the second side of the carrier is provided with an anticorrosion layer which is at least one layer selected from the group consisting of a lacquer layer, a sol-gel coating, an adhesive film, and a layer selected from $ZrO_2$, $SiO_2$, $Al_2O_3$ or $Nb_2O_5$, and wherein the anticorrosion layer preferably has a thickness of 20 to 400 nm.

9. The composite material according to claim 1, wherein on the first side, the solar absorptance according DIN ISO 22975-3:2014; Annex A is higher than 80%, and the thermal emittance according DIN ISO 22975-3:2014; Annex A for a surface temperature of 100° C. is less than 15%, and wherein on the second side, the thermal emittance according DIN ISO 22975-3:2014; Annex A for a surface temperature of 100° C. is less than 20%.

10. A panel which is at least one of a solar radiation absorbent wall panel structure or a solar radiation absorbent roof panel structure, the panel comprising a composite material for conversion of solar radiation to heat, comprising:
   a carrier comprising a first side and a second side, composed of aluminum, an aluminum alloy, copper, electrolytic chromium coated steel (ECCS) or stainless steel, wherein at least the following layers are present on the first side of the carrier in the following order:
   an adhesion layer composed of chromium, titanium, nickel, molybdenum, tungsten, alloys of two or more of these metals, or a non-ferromagnetic nickel alloy with at least one metal selected from the group consisting of chromium, aluminum, vanadium and copper, having a thickness of 1 to 15 nm, on the carrier,
   a protection layer composed of a nitride, a carbide or a carbonitride of a metal or a mixture of two or more metals from subgroups IV, V or VI of the periodic system, on the adhesion layer,
   a first absorber layer of a metal compound having a composition $(Me_rAl_{1-r})O_xN_yC_z$, wherein Me represents at least one metal selected from titanium, zirconium and hafnium, wherein r is from 0.1 to 1.0, x is from 0 to 1.9, y is from 0 to 0.95, z is from 0 to 0.5 and x+y+z is from 0.5 to 1.9, or a composition $(Cr_rAl_{1-r})O_xN_yC_z$, wherein r is from 0.1 to 1.0, x is from 0 to 1.4, y is from 0 to 0.5, z is from 0 to 0.95 and x+y+z is from 0.8 to 1.4, on the protection layer,
   a second absorber layer of a metal compound having the composition $(Me_rAl_{1-r})O_xN_yC_z$ or $(CrrAl_{1-r})O_xN_yC_z$, as defined for the first absorber layer, on the first absorber layer, wherein the composition is different from that in the first absorber layer, and
   a protection layer that is at least one of dielectric and/or oxidic antireflection, and having with a refractive index from 1.8 to 2.5 in the visible wavelength range from 380 nm to 780 nm, which is selected from the group consisting of $ZrO_2$, Y stabilized $ZrO_2$, $Cr_2O_3$, $Nb_2O_5$, $Si_3N_4$, $Y_2O_3$, $Ta_2O_5$, and a mixture of $ZrO_2$ and $Ta_2O_5$, on the second absorber layer.

11. The panel according claim 10, wherein the panel has a shape defining a space facilitating heated air to be collected and conducted, the space being surrounded by the second side of the composite material.

12. The panel according to claim 10, further comprising a plurality of air inlet openings which facilitate air heated at the first side on a surface of the composite material to pass through the openings from the first side to the second side of the composite material.

13. The panel according to claim 10, wherein the panel has the shape of a trapezoidal sheet or a corrugated sheet.

14. The panel according to claim 10, wherein pipes or conduits are fixed on the second side of the composite material, facilitating heating of a fluid circulating in the tubes.

15. The panel according to claim 10, wherein the second side of the composite material is attached to a facade element or a roof element using an adhesive tape to form a panel for a solar thermal activated facade.

16. A solar structure which is at least one of a solar facade or a solar roof, the solar structure comprising a panel which is at least one of a solar radiation absorbent wall panel structure or a roof panel structure, the panel comprising a composite material for conversion of solar radiation to heat, comprising:
   a carrier comprising a first side and a second side, composed of aluminum, an aluminum alloy, copper, electrolytic chromium coated steel (ECCS) or stainless steel, wherein at least the following layers are present on the first side of the carrier in the following order:
   an adhesion layer composed of chromium, titanium, nickel, molybdenum, tungsten, alloys of two or more of these metals, or a non-ferromagnetic nickel alloy with at least one metal selected from the group consisting of chromium, aluminum, vanadium and copper, having a thickness of 1 to 15 nm, on the carrier,
   a protection layer composed of a nitride, a carbide or a carbonitride of a metal or a mixture of two or more metals from subgroups IV, V or VI of the periodic system, on the adhesion layer,
   a first absorber layer of a metal compound having a composition $(Me_rAl_{1-r})O_xN_yC_z$, wherein Me represents at least one metal selected from titanium. zirconium and hafnium, wherein r is from 0.1 to 1.0, x is from 0 to 1.9, y is from 0 to 0.95, z is from 0 to 0.5 and x+y+z is from 0.5 to 1.9, or a composition $(Cr_rAl_{1-r})O_xN_yC_z$, wherein r is from 0.1 to 1.0, x is from 0 to 1.4, y is from 0 to 0.5, z is from 0 to 0.95 and x+y+z is from 0.8 to 1.4, on the protection layer,
   a second absorber layer of a metal compound having the composition $(Me_rAl_{1-r})O_xN_yC_z$ or $(CrrAl_{1-r})O_xN_yC_z$, as defined for the first absorber layer, on the first absorber layer, wherein the composition is different from that in the first absorber layer, and
   a protection layer that is at least one of dielectric and/or oxidic antireflection. and having with a refractive index from 1.8 to 2.5 in the visible wavelength range from 380 nm to 780 nm, which is selected from the group consisting of $ZrO_2$, Y stabilized $ZrO_2$, $Cr_2O_3$, $Nb_2O_5$, $Si_3N_4$, $Y_2O_3$, $Ta_2O_5$, and a mixture of $ZrO_2$ and $Ta_2O_5$, on the second absorber layer,
   wherein the panel includes a plurality of panels which are arranged so as to overlap with respective adjacent panels to form the solar facade or the solar roof.

17. The composite material according to claim 4, wherein the first absorber layer is composed of $CrO_xN_y$, and wherein x is from 1.1 to 1.3, and y is from 0.05 to 0.1.

18. The composite material according to claim 5, wherein the second absorber layer is composed of $CrO_xN_y$, and wherein x is from 1.1 to 1.3, and y is from 0.05 to 0.1.

19. The composite material according to 6, wherein the sol-gel protection layer has a thickness from 1 μm to 3 μm on the antireflection and protection layer.

20. The composite material according to claim 9, wherein on the first side, the solar absorptance according DIN ISO 22975-3:2014; Annex A is higher than 90% and the thermal emittance according DIN ISO 22975-3:2014; Annex A for a surface temperature of 100° C. is less than 10%, and wherein on the second side, the thermal emittance according DIN ISO 22975-3:2014; Annex A for the surface temperature of 100° C. is less than 15%.

* * * * *